(12) United States Patent
Scheuerlein et al.

(10) Patent No.: US 7,272,052 B2
(45) Date of Patent: Sep. 18, 2007

(54) DECODING CIRCUIT FOR NON-BINARY GROUPS OF MEMORY LINE DRIVERS

(75) Inventors: Roy E. Scheuerlein, Cupertino, CA (US); Christopher J. Petti, Mountain View, CA (US); Luca G. Fasoli, San Jose, CA (US)

(73) Assignee: SanDisk 3D LLC, Sunnyvale, CA (US)

( * ) Notice: Subject to any disclaimer, the term of this patent is extended or adjusted under 35 U.S.C. 154(b) by 158 days.

(21) Appl. No.: 11/146,952

(22) Filed: Jun. 7, 2005

(65) Prior Publication Data

US 2006/0221702 A1 Oct. 5, 2006

Related U.S. Application Data

(63) Continuation-in-part of application No. 11/095,905, filed on Mar. 31, 2005, now Pat. No. 7,054,219.

(51) Int. Cl.
*G11C 16/06* (2006.01)
(52) U.S. Cl. .................... 365/185.23; 365/185.03; 365/230.03; 365/230.06
(58) Field of Classification Search ........... 365/185.23, 365/230.06
See application file for complete search history.

(56) References Cited

U.S. PATENT DOCUMENTS

| | | |
|---|---|---|
| 4,602,354 A | 7/1986 | Craycraft et al. |
| 4,646,266 A | 2/1987 | Ovshinsky et al. |
| 4,868,616 A | 9/1989 | Johnson et al. |
| 5,220,518 A * | 6/1993 | Haq ............................. 365/51 |
| 5,301,144 A | 4/1994 | Kohno |
| 5,429,968 A | 7/1995 | Koyama |

(Continued)

FOREIGN PATENT DOCUMENTS

EP 0 073 486 A2 3/1983

(Continued)

OTHER PUBLICATIONS

Compardo, Giovanni et al., "40-$mm^2$ 3-V-Only 50-MHz 64-Mb 2-b/cell CHE NOR Flash Memory," IEEE Journal of Solid State Circuits, vol. 35, No. 11, Nov. 2000, pp. 1655-1667.

(Continued)

*Primary Examiner*—Richard T. Elms
*Assistant Examiner*—Eric Wendler
(74) *Attorney, Agent, or Firm*—Brinks Hofer Gilson & Lione

(57) ABSTRACT

A decoding circuit for non-binary groups of memory line drivers is disclosed. In one embodiment, an integrated circuit is disclosed comprising a binary decoder and circuitry operative to perform a non-binary arithmetic operation, wherein a result of the non-binary arithmetic operation is provided as input to the binary decoder. In another embodiment, an integrated circuit is disclosed comprising a memory array comprising a plurality of array lines, a non-integral-power-of-two number of array line driver circuits, and control circuitry configured to select one of the array line driver circuits. The control circuitry can comprise a binary decoder and a pre-decoder portion that performs a non-binary arithmetic operation. The concepts described herein may be used alone or in combination.

27 Claims, 14 Drawing Sheets

U.S. PATENT DOCUMENTS

| | | | |
|---|---|---|---|
| 5,568,421 A | 10/1996 | Aritome | |
| 5,583,500 A * | 12/1996 | Allen et al. | 341/107 |
| 5,621,683 A | 4/1997 | Young | |
| 5,715,189 A | 2/1998 | Asakura | |
| 5,751,012 A | 5/1998 | Wolstenholme et al. | |
| 5,835,396 A | 11/1998 | Zhang | |
| 5,854,763 A * | 12/1998 | Gillingham et al. | 365/189.04 |
| 5,926,415 A | 7/1999 | Shin | |
| 5,991,193 A | 11/1999 | Gallagher et al. | |
| 6,004,825 A | 12/1999 | Seyyedy | |
| 6,005,270 A | 12/1999 | Noguchi | |
| 6,034,882 A | 3/2000 | Johnson et al. | |
| 6,055,180 A | 4/2000 | Gudesen et al. | |
| 6,128,214 A | 10/2000 | Kuekes et al. | |
| 6,130,835 A | 10/2000 | Scheuerlein | |
| 6,134,168 A * | 10/2000 | Harrington et al. | 365/222 |
| 6,163,048 A | 12/2000 | Hirose et al. | |
| 6,185,121 B1 | 2/2001 | O'Neill | |
| 6,185,122 B1 | 2/2001 | Johnson et al. | |
| 6,324,093 B1 | 11/2001 | Perner et al. | |
| 6,335,890 B1 | 1/2002 | Reohr et al. | |
| 6,356,477 B1 | 3/2002 | Tran | |
| 6,363,000 B2 | 3/2002 | Perner et al. | |
| 6,385,074 B1 | 5/2002 | Johnson et al. | |
| 6,420,215 B1 | 7/2002 | Knall et al. | |
| 6,445,613 B1 | 9/2002 | Nagai | |
| 6,462,979 B2 | 10/2002 | Schlösser et al. | |
| 6,473,328 B1 | 10/2002 | Mercaldi | |
| 6,477,077 B1 | 11/2002 | Okazawa | |
| 6,490,194 B2 | 12/2002 | Hoenigschmid | |
| 6,498,747 B1 | 12/2002 | Gogl et al. | |
| 6,504,246 B2 | 1/2003 | Roth et al. | |
| 6,515,888 B2 | 2/2003 | Johnson et al. | |
| 6,522,594 B1 | 2/2003 | Scheuerlein | |
| 6,525,953 B1 | 2/2003 | Johnson | |
| 6,545,898 B1 | 4/2003 | Scheuerlein | |
| 6,567,287 B2 | 5/2003 | Scheuerlein | |
| 6,584,006 B2 | 6/2003 | Viehmann | |
| 6,611,453 B2 | 8/2003 | Ning | |
| 6,618,295 B2 | 9/2003 | Scheuerlein | |
| 6,631,085 B2 | 10/2003 | Kleveland et al. | |
| 6,639,822 B2 | 10/2003 | Fujisawa et al. | 365/63 |
| 6,661,730 B1 | 12/2003 | Scheuerlein et al. | |
| 6,687,147 B2 | 2/2004 | Fricke et al. | |
| 6,704,224 B2 | 3/2004 | Natori | 365/185.18 |
| 6,735,104 B2 | 5/2004 | Scheuerlein | |
| 6,822,903 B2 | 11/2004 | Scheuerlein et al. | |
| 6,849,905 B2 | 2/2005 | Ilkbahar et al. | |
| 6,856,572 B2 | 2/2005 | Scheuerlein et al. | |
| 6,859,410 B2 | 2/2005 | Scheuerlein et al. | |
| 6,873,567 B2 * | 3/2005 | Buettner et al. | 365/230.06 |
| 6,879,505 B2 | 4/2005 | Scheuerlein | |
| 6,881,994 B2 | 4/2005 | Lee et al. | |
| 7,054,219 B1 * | 5/2006 | Petti et al. | 365/230.06 |
| 7,142,471 B2 | 11/2006 | Fasoli et al. | 365/200 |
| 7,177,227 B2 | 1/2007 | Petti et al. | 365/230.06 |
| 2002/0054505 A1 * | 5/2002 | Micheloni et al. | 365/185.03 |
| 2003/0021148 A1 | 1/2003 | Scheuerlein | |
| 2003/0202404 A1 | 10/2003 | Scheuerlein | |
| 2004/0002184 A1 | 1/2004 | Cleeves | |
| 2004/0068704 A1 | 4/2004 | Park et al. | |
| 2004/0124415 A1 | 7/2004 | Walker et al. | |
| 2004/0124466 A1 | 7/2004 | Walker et al. | |
| 2004/0125629 A1 | 7/2004 | Scheuerlein et al. | |
| 2004/0145024 A1 | 7/2004 | Chen et al. | |
| 2004/0188714 A1 | 9/2004 | Scheuerlein et al. | |
| 2005/0121790 A1 | 6/2005 | Cleeves et al. | |
| 2005/0122779 A1 | 6/2005 | Fasoli et al. | |
| 2005/0122780 A1 | 6/2005 | Chen et al. | |
| 2005/0128807 A1 | 6/2005 | Chen et al. | |
| 2006/0145193 A1 | 7/2006 | So et al. | 257/208 |
| 2006/0146639 A1 | 7/2006 | Fasoli et al. | 365/230.06 |
| 2006/0221752 A1 | 10/2006 | Fasoli et al. | 365/230.03 |

FOREIGN PATENT DOCUMENTS

| | | |
|---|---|---|
| EP | 0 395 886 A2 | 11/1990 |
| EP | 0 924 709 A2 | 6/1999 |
| JP | 1998-10149688 | 6/1998 |
| JP | 2001-028427 | 1/2001 |
| JP | 2002-280467 | 9/2002 |
| WO | WO-2002-43067 | 5/2002 |

OTHER PUBLICATIONS

Crowley, Matthew et al., "512Mb PROM with 8 Layers of Antifuse/Diode Cells", 2003 IEEE ISSCC Conference, Session 16, Non-Volatile Memory, Paper 16.4, pp. 1-3, and corresponding presentation slides (23 pages).

Durlam, M. et al., "Nonvolatile RAM Based on Magnetic Tunnel Junction Elements," 2000 IEEE International Solid State Circuits Conference, ISSCC2000/Session 7/TD: Emerging Memory & Device Technologies, Feb. 2000, pp. 130-131.

Evans, Robert J. et al., "Energy Consumption Modeling and Optimization for SRAM's," IEEE Journal of Solid-State Circuits, vol. 30, No. 5, May 1995, pp. 571-579.

Greene, Jonathan et al., "Antifuse Field Programmable Gate Arrays," Proceedings of the IEEE, vol. 81, No. 7, New York, Jul. 1993, pp. 1042-1056.

Motta, Ilaria et al., "High-Voltage Management in Single-Supply CHE NOR-Type Flash Memories," Proceedings of the IEEE, vol. 91, No. 4, Apr. 2003, pp. 554-568.

Naji, Peter K. et al. "A 256k 3.0V 1T1MTJ Nonvolatile Magnetoresistive RAM," 2001 IEEE ISSCC, Feb. 6, 2001, Paper 7.6, and corresponding presentation slides (35 pages).

Nishihara, Toshiyuki et al., "A Quasi-Matrix Ferroelectric Memory for Future Silicon Storage," IEEE Journal of Solid-State Circuits, vol. 37, No. 11, Nov. 2002, pp. 1479-1484.

Okuda, Takashi et al., "A Four-level Storage 4-Gb DRAM," IEEE Journal of Solid-State Circuits, vol. 32, No. 11, Nov. 1997, pp. 1743-1747.

Sugibayashi, Tadahiko et al., "A 30-ns 256-Mb DRAM with a Multidivided Array Structure," IEEE Journal of Solid-State Circuits, vol. 28, No. 11, Nov. 1993, pp. 1092-1098.

Takeuchi, Ken et al., "A Negative Vth Cell Architecture for Highly Scalable, Excellently Noise-Immune, and Highly Reliable NAND Flash Memories," IEEE Journal of Solid-State Circuits, vol. 34, No. 5, May 1999, pp. 675-684.

* cited by examiner

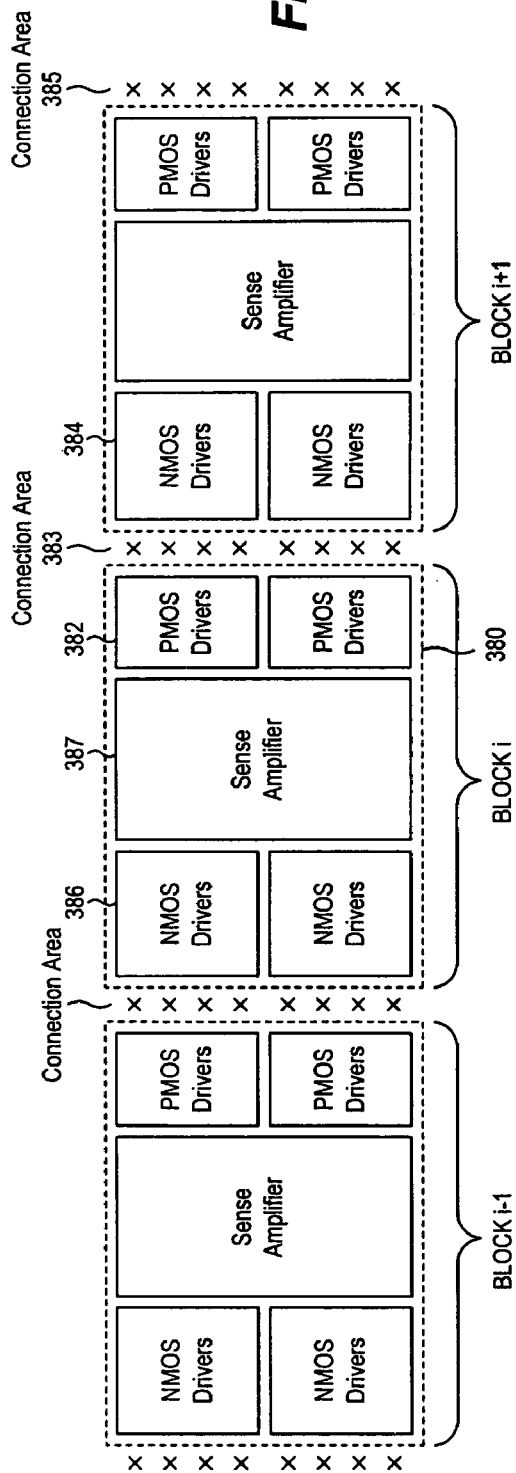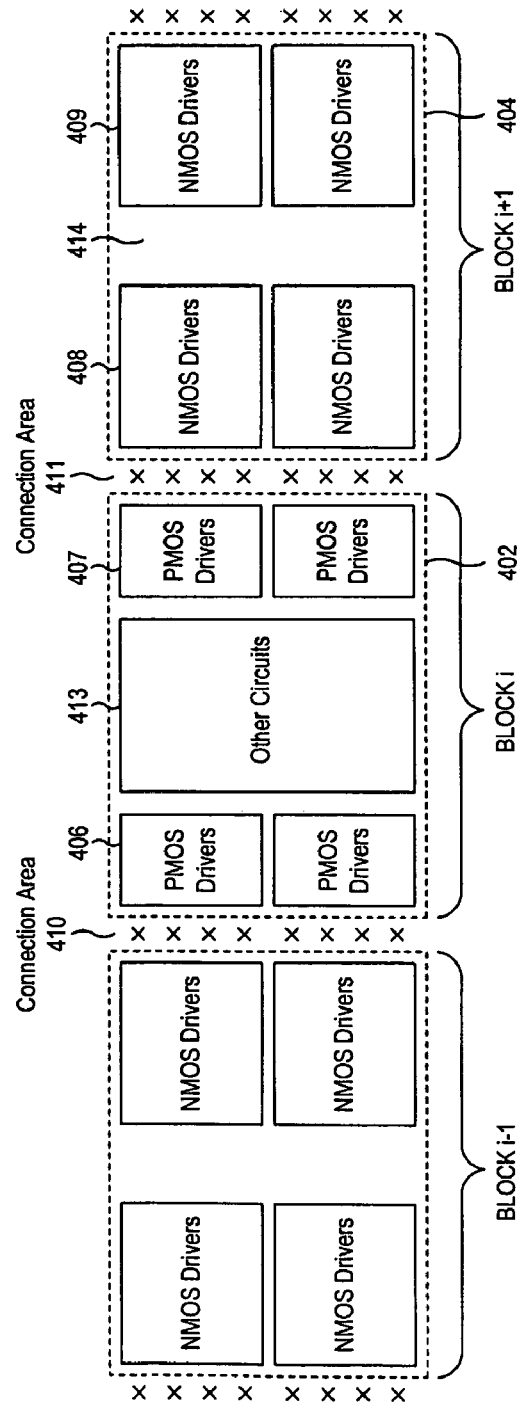

FIG. 19

| Word Line count | Address | Source Selection | Global Row Dec |
|---|---|---|---|
| 0 | 0000000000 | 0000 | 0000000 |
| 1 | 0000000001 | 0001 | 0000000 |
| 2 | 0000000010 | 0010 | 0000000 |
| 3 | 0000000011 | 0011 | 0000000 |
| 4 | 0000000100 | 0100 | 0000000 |
| 5 | 0000000101 | 0101 | 0000000 |
| 6 | 0000000110 | 0110 | 0000000 |
| 7 | 0000000111 | 0111 | 0000000 |
| 8 | 0000001000 | 1000 | 0000000 |
| 9 | 0000001001 | 1001 | 0000000 |
| 10 | 0000001010 | 1010 | 0000000 |
| 11 | 0000001011 | 1011 | 0000000 |
| 12 | 0000001100 | 0000 | 0000001 |
| 13 | 0000001101 | 0001 | 0000001 |
| 14 | 0000001110 | 0010 | 0000001 |
| 15 | 0000001111 | 0011 | 0000001 |
| 16 | 0000010000 | 0100 | 0000001 |
| 17 | 0000010001 | 0101 | 0000001 |
| 18 | 0000010010 | 0110 | 0000001 |
| 19 | 0000010011 | 0111 | 0000001 |
| 20 | 0000010100 | 1000 | 0000001 |
| 21 | 0000010101 | 1001 | 0000001 |
| 22 | 0000010110 | 1010 | 0000001 |
| 23 | 0000010111 | 1011 | 0000001 |

FIG. 20

| Word Line count | Address | Source Selection | Global Row Dec |
|---|---|---|---|
| 0 to 3 | 00000000xy | 00xy | 0000000 |
| 4 to 7 | 00000001xy | 01xy | 0000000 |
| 8 to 11 | 00000010xy | 10xy | 0000000 |
| 12 to 15 | 00000011xy | 00xy | 0000001 |
| 16 to 19 | 00000100xy | 01xy | 0000001 |
| 20 to 23 | 00000101xy | 10xy | 0000001 |
| 24 to 27 | 00000110xy | 00xy | 0000010 |
| 28 to 31 | 00000111xy | 01xy | 0000010 |
| 32 to 35 | 00001000xy | 10xy | 0000010 |
| 36 to 39 | 00001001xy | 00xy | 0000011 |
| 40 to 43 | 00001010xy | 01xy | 0000011 |
| 44 to 47 | 00001011xy | 10xy | 0000011 |
| 48 to 51 | 00001100xy | 00xy | 0000100 |
| 52 to 55 | 00001101xy | 01xy | 0000100 |
| 56 to 59 | 00001010xy | 10xy | 0000100 |
| 60 to 63 | 00001111xy | 00xy | 0000101 |
| 64 to 67 | 00010000xy | 01xy | 0000101 |
| 68 to 71 | 00010001xy | 10xy | 0000101 |
| 72 to 75 | 00010010xy | 00xy | 0000110 |
| 76 to 79 | 00010011xy | 01xy | 0000110 |
| 80 to 83 | 00010100xy | 10xy | 0000110 |
| 84 to 87 | 00010101xy | 00xy | 0000111 |
| 88 to 91 | 00010110xy | 01xy | 0000111 |
| 92 to 95 | 00010111xy | 10xy | 0000111 |
| 96 to 98 | 00011000xy | 00xy | 0001000 |

DECODING CIRCUIT FOR NON-BINARY GROUPS OF MEMORY LINE DRIVERS

CROSS-REFERENCE TO RELATED APPLICATION

This application is a continuation-in-part of U.S. patent application Ser. No. 11/095,905, filed Mar. 31, 2005, now U.S. Pat. No. 7,054,219 which is hereby incorporated by reference.

FIELD OF THE INVENTION

The present invention relates to semiconductor integrated circuits containing memory arrays, and in preferred embodiments the invention particularly relates to monolithic three-dimensional memory arrays.

BACKGROUND

Ongoing developments in semiconductor processing technologies and memory cell technologies have continued to increase the density achieved in integrated circuit memory arrays. For example, certain passive element memory cell arrays, such as those including an antifuse cell, may be fabricated having word lines approaching the minimum feature size (F) and minimum feature spacing for the particular word line interconnect layer, and also having bit lines approaching the minimum feature width and minimum feature spacing for the particular bit line interconnect layer. Moreover, three-dimensional memory arrays having more than one plane or level of memory cells have been fabricated implementing such so-called $4F^2$ memory cells on each memory plane. Exemplary three-dimensional memory arrays are described in U.S. Pat. No. 6,034,882 to Johnson, entitled "Vertically Stacked Field Programmable Nonvolatile Memory and Method of Fabrication," and in U.S. Pat. No. 5,835,396 to Zhang, entitled "Three-Dimensional Read-Only Memory Array."

Implementing such three-dimensional memory arrays having $4F^2$ memory cells on each memory plane presents challenges in the design and layout of decoding and memory layer interface circuitry capable of interfacing with such tightly-pitched array lines.

SUMMARY

A decoding circuit for non-binary groups of memory line drivers is disclosed. In one embodiment, an integrated circuit is disclosed comprising a binary decoder and circuitry operative to perform a non-binary arithmetic operation, wherein a result of the non-binary arithmetic operation is provided as input to the binary decoder. In another embodiment, an integrated circuit is disclosed comprising a memory array comprising a plurality of array lines, a non-integral-power-of-two number of array line driver circuits, and control circuitry configured to select one of the array line driver circuits. The control circuitry can comprise a binary decoder and a pre-decoder portion that performs a non-binary arithmetic operation. The concepts described herein may be used alone or in combination.

The foregoing is a summary and thus contains, by necessity, simplifications, generalizations and omissions of detail. Consequently, those skilled in the art will appreciate that the foregoing summary is illustrative only and that it is not intended to be in any way limiting of the invention. Other aspects, inventive features, and advantages of the present invention, as defined solely by the claims, may be apparent from the detailed description set forth below.

BRIEF DESCRIPTION OF THE DRAWINGS

The present invention may be better understood, and its numerous objects, features, and advantages made apparent to those skilled in the art by referencing the accompanying drawings.

FIG. 11 is a block diagram of a useful relative arrangement of driver transistors for a multi-headed array line driver circuit.

FIG. 12 is a block diagram of a useful relative arrangement of driver transistors for a multi-headed array line driver circuit.

FIG. 19 is a diagram of a partial decode map of a preferred embodiment.

FIG. 20 is a diagram of a compressed decode map of a preferred embodiment.

The use of the same reference symbols in different drawings indicates similar or identical items.

DETAILED DESCRIPTION

Figure 1:
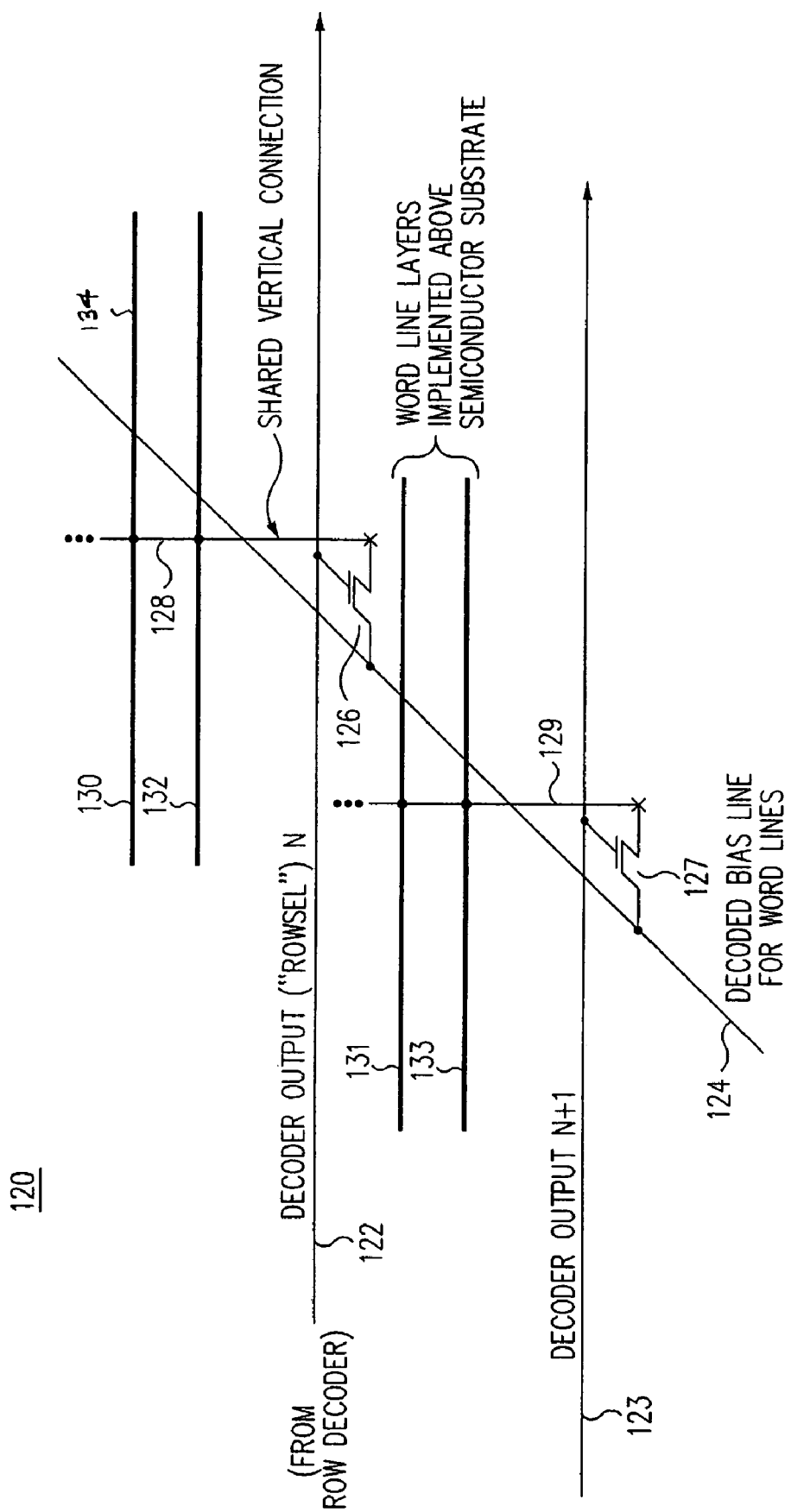
FIG. 1 is a schematic diagram representing a three-dimensional memory array having a segmented word line arrangement.

Referring now to FIG. 1, a schematic diagram is shown representing a three-dimensional memory array having a segmented word line arrangement. Each word line is formed by one or more word line segments on at least one, and advantageously more than one, word line layer of the memory array. For example, a first word line is formed by word line segment 130 disposed on one word line layer of the memory array and by word line segment 132 disposed on another word line layer. The word line segments 130, 132 are connected by a vertical connection 128 to form the first word line. The vertical connection 128 also provides a connection path to a driver device 126 disposed in another layer (e.g., within the semiconductor substrate). A decoded output 122 from a row decoder (not shown) traverses substantially parallel to the word line segments 130, 132 and when selected, couples the word line segments 130, 132 through device 126 to a decoded bias line 124 which traverses substantially perpendicular to the word line segments.

Also shown are word line segments 131, 133 which are connected by a vertical connection 129 to form a second word line and to provide a connection path to driver device 127. Another decoded output 123 from the row decoder couples, when selected, these word line segments 131, 133 through device 127 to the decoded bias line 124. As described in the next figure, the vertical connections 128, 129 are preferably disposed between two memory blocks, and word lines within one block are shared with word lines in an adjacent block. In other words, a word line segment 130 is disposed in one memory block and is shared with another word line segment 134 in the adjacent block.

Figure 2:
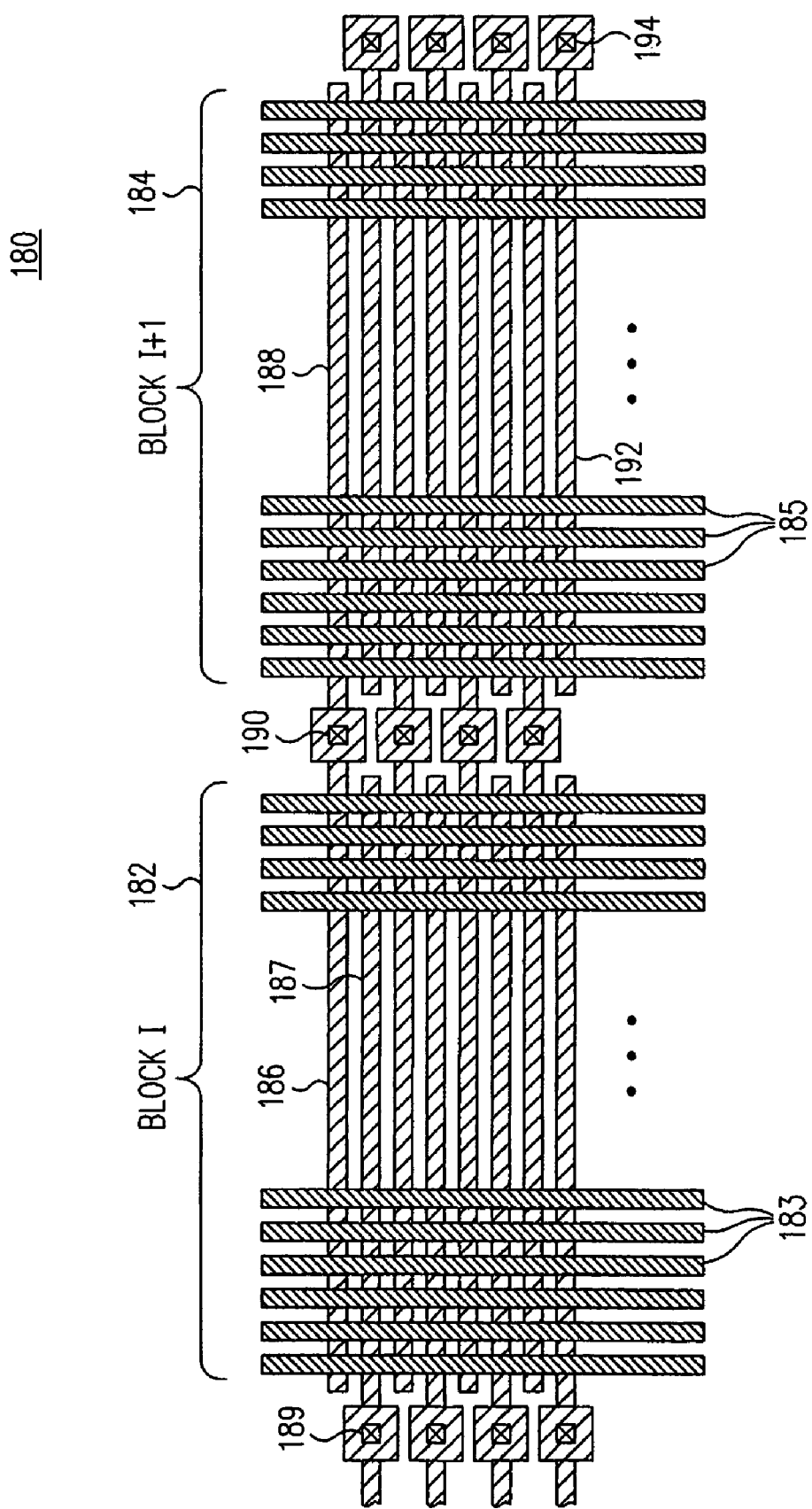
FIG. 2 is a top view representing a word line layer and a bit line layer of a three-dimensional memory array, which shows 2:1 interleaved word line segments, where vertical connections to half of the word line segments for a block are on the left side of the block, and vertical connections to the other half of the word line segments for the block are on the right side of the block. In addition, a word line segment from two adjacent blocks shares each vertical connection.

FIG. 2 is a top view representing a word line layer and a bit line layer of a three-dimensional memory array such as described in the previous figure. Memory blocks 182, 184 are shown respectively including a plurality of bit lines 183, 185, and having 2:1 interleaved word line segments. Vertical connections to half of the word line segments for a block are on the left side of the block (e.g., word line segment 187 and vertical connection 189), and vertical connections to the other half of the word line segments for the block are on the right side of the block (e.g., word line segment 186 and vertical connection 190). In addition, each vertical connection serves a word line segment in each of two adjacent blocks. For example, vertical connection 190 connects to word line segment 186 in array block 182 and connects to word line segment 188 in array block 184. In other words, each vertical connection (such as vertical connection 190) is shared by a word line segment in each of two adjacent blocks. As would be expected, however, the respective "outside" vertical connections for the first and last array blocks may serve only word line segments in the first and last array blocks. For example, if block 184 is the last block of a plurality of blocks forming a memory array, its outside vertical connections (e.g., vertical connection 194) may serve only the word line segment 192 within block 184, and are thus not shared by two word line segments as throughout the remainder of the array.

By interleaving the word line segments as shown, the pitch of the vertical connections is twice the pitch of the individual word lines themselves. This is particularly advantageous since the word line pitch which is achievable for many passive element memory cell arrays is significantly smaller than achievable for many via structures which might be employed to form the vertical connections.

Other word line layers and bit line layers may be implemented identically with those shown and thus would share the same vertical connections, as described in FIG. 1. Additional description of exemplary memory structures may be found in "Word Line Arrangement Having Multi-Layer Word Line Segments for Three-Dimensional Memory Array" by Scheuerlein, U.S. Published patent application Ser. No. U.S.2004-0190360, the disclosure of which is hereby incorporated by reference in its entirety. However, while many exemplary embodiments may be described in the context of a three-dimensional memory array (i.e., a monolithic semiconductor integrated circuit incorporating more than one memory plane formed above and below each other), other embodiments of the present invention having only a single memory plane are also specifically contemplated.

The memory array 180 is preferably a passive element memory array (PEMA) incorporating passive element memory cells, although other types of memory cells are also specifically contemplated. As used herein, a passive element memory array includes a plurality of 2-terminal memory cells, each connected between an associated X-line and an associated Y-line. Such a memory array may be a two-dimensional (planar) array or may be a three-dimensional array having more than one plane of memory cells. Each such memory cell has a non-linear conductivity in which the current in a reverse direction (i.e., from cathode to anode) is lower than the current in a forward direction. Application of a voltage from anode to cathode greater than a programming level changes the conductivity of the memory cell. The conductivity may decrease when the memory cell incorporates a fuse technology, or may increase when the memory cell incorporates an anti-fuse technology. A passive element memory array is not necessarily a one-time programmable (i.e., write once) memory array.

Such passive element memory cells may generally be viewed as having a current steering element directing current in a direction and another component which is capable of changing its state (e.g., a fuse, an antifuse, a capacitor, a resistive element, etc.). The programming state of the memory element can be read by sensing current flow or voltage drop when the memory element is selected.

Figure 3:
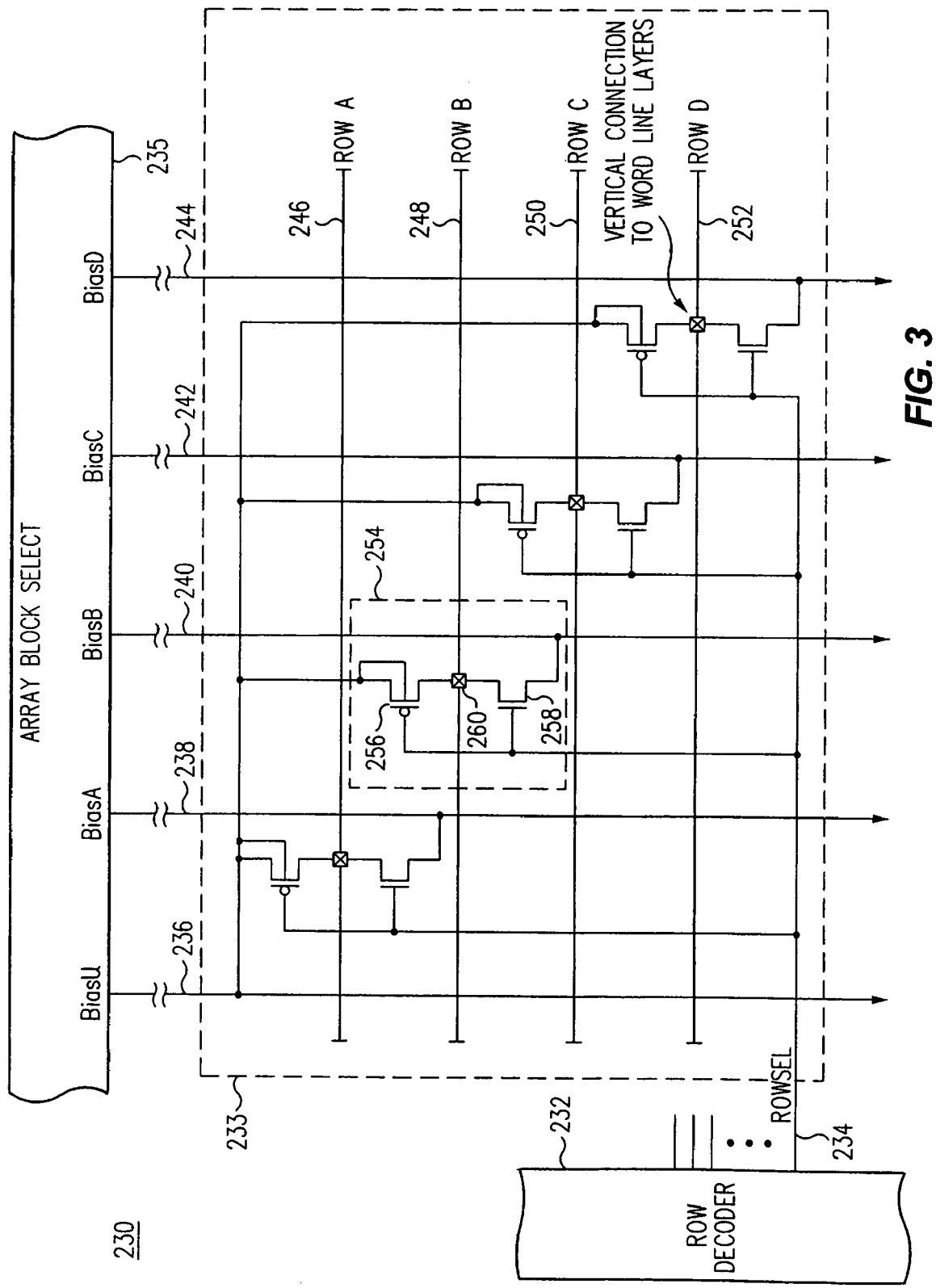
FIG. 3 is a schematic diagram representing a multi-headed word line decoder having bias lines traversing perpendicular to the word line segments and having a row select line traversing parallel to the word line segments.

FIG. 3 is a schematic diagram representing a multi-headed word line decoder configuration 230 having bias lines traversing perpendicular to the word line segments and having decoded row select lines (sometimes referred to herein as a "select node" or a "global word line") traversing parallel to the word line segments. A row decoder 232 generates a plurality of decoded row select lines, one of which is labeled 234. An array block select circuit 235 generates an unselected bias level BiasU on node 236, and generates four decoded bias levels BiasA, BiasB, BiasC, and BiasD respectively on nodes 238, 240, 242, and 244. A quad word line driver circuit 233 includes four separate word line driver circuits 254, each for driving a respective word line to the unselected bias line BiasU (when the row select 234 is unselected) or to a respective one of the four "selected" bias lines BiasA, BiasB, BiasC, and BiasD (when the row select 234 is selected).

Referring to the individual word line driver circuit labeled 254, a first transistor 256 drives the word line 248 (by way of the vertical connection 260) to the unselected bias level BiasU when the row select 234 is low, as would be the case for all the unselected row select lines generated by the row decoder 232. A second transistor 258 drives the word line 248 (also labeled ROW B, which typically includes one or more word line segments on each of more than one word line layer) to the associated bias level BiasB when the row select 234 is high, as would be the case for the one "selected" row select line generated by the row decoder 232. Generalizing to all four word lines, when the row select 234 is high, each of the word lines 246, 248, 250, and 252 is respectively driven to its associated bias line BiasA, BiasB, BiasC, and BiasD. One of the bias lines BiasA, BiasB, BiasC, and BiasD is driven to a selected level, while the remaining three of the bias lines are maintained at an unselect bias level, such as the BiasU level. Consequently, one of the four word lines 246, 248, 250, and 252 is respectively driven to the selected bias level while the remaining three word lines remain at the unselected bias level. The vertical connection 260 corresponds to vertical connection 128 shown in FIG. 1.

In the exemplary configuration shown, the row select 234 is selected when it is high, and unselected when it is low, and the unselected bias level BiasU is higher than the selected one of the four bias levels BiasA, BiasB, BiasC, and BiasD. Consequently the transistor 256 is advantageously implemented as P-channel device and the transistor 258 as an N-channel device. Exemplary voltages for memory array incorporating antifuse memory cells are a selected bias level of 0 volts and an unselected bias level BiasU of nominally 9 volts. In other embodiments the polarity of the voltages, and the polarity of the driver transistors 256, 258 may be reversed. Moreover, other driver devices may be utilized, such as two N-channel transistors, depending on the particular memory cell technology and the desired unselected and selected word line voltages. While four such decoded selected bias lines are described above, other numbers of such lines, such as two bias lines, may be provided, with each row select node consequently being coupled to two word line driver circuits within each group of drivers, or even just one selected bias line provided in other embodiments.

Figure 4:
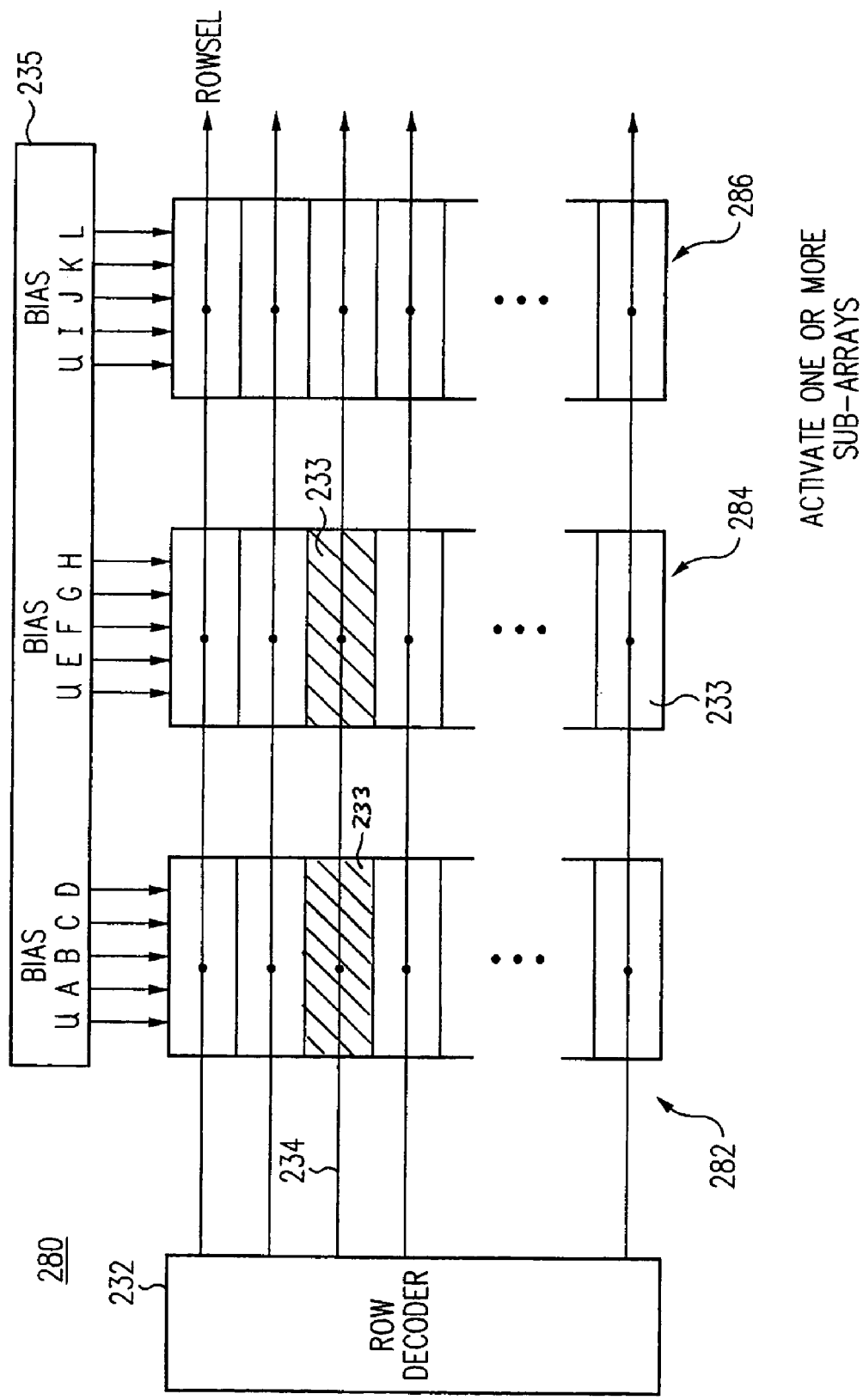
FIG. 4 is a schematic diagram representing a multi-headed word line decoder having multiple four-headed driver circuits, such as that depicted in FIG. 3, spaced across at least a portion of the memory array.

FIG. 4 is a schematic diagram representing a multi-headed word line decoder having multiple four-headed driver circuits, such as that depicted in FIG. 3, spaced across at least a portion of the memory array. The row decoder 232 generates a plurality of decoded row select lines, one of which is labeled 234, as before. An array block select circuit 235 generates an unselected bias level BiasU, and generates four decoded bias levels BiasA, BiasB, BiasC, and BiasD, here labeled as U, A, B, C, and D. Each of a vertical group 282 of quad word line driver circuits 233 is responsive to a respective one of the row select lines generated by the row decoder 232. All of the quad word line driver circuits 233 within the group 282 are associated with the U, A, B, C, and D bias lines, as suggested by the configuration shown in FIG. 3.

In this embodiment, however, the array block select circuit 235 also generates another respective set of bias lines for each of two additional groups 284, 286 of quad word line driver circuits 233. The second set of bias lines includes an unselected bias level BiasU, and generates four decoded bias levels BiasE, BiasF, BiasG, and BiasH, here labeled as U, E, F, G, and H. The third set of bias lines includes an unselected bias level BiasU, and generates four decoded bias levels BiasI, BiasJ, BiasK, and BiasL, here labeled as U, I, J, K, and L. Referring again at the row select 234, one quad word line driver circuit 233 in each of the groups 282, 284, and 286 is responsive to the row select 234 signal, and the array block select circuit 235 may be implemented to decode the bias lines A, B, C, . . . , K, L so that only one such bias line is selected (i.e., driven to the selected bias level). As a result, only one word line associated with row select 234 is selected, and the remaining eleven word lines that are associated with row select 234 remain unselected. Such an arrangement may be extended to drive a much larger number of word line driver circuits 233 across an array.

Each word line driver 254 may be assumed for this exemplary circuit to be coupled to a word line segment in each of two adjacent array blocks (e.g., an array such as that shown in FIG. 2). Consequently, two bit line select circuits (not shown) may be associated with the group 282 of word line driver circuits, one for each of the two adjacent array blocks having word lines driven by the group 282. Consequently, each is respectively driven with a column decoder output signal (not shown) that is active whenever the selected word line is associated with the group 282. Exemplary column decoder and column select circuitry may take on a variety of implementations, but is preferably implemented as described in "Tree Decoder Structure Particularly Well Suited to Interfacing Array Lines Having Extremely Small Layout Pitch," U.S. Pat. No. 6,859,410, the disclosure of which is hereby incorporated by reference in its entirety.

Since each array block is assumed (for this embodiment) to have half of its word lines driven from one side and the other half of its word lines driven from the other side, the right-most array block associated with the group 282 may also be associated with group 284

As with many of the embodiments described herein, the word lines are connected to the cathode end of the memory cell (i.e., the n-type side of the diode). The word line segments in a block are interleaved, with half sharing a vertical connection on the right side of the block with word line segments in the adjacent block, and the other half sharing a vertical connection with word line segments to the left of the block. Each vertical connection may be formed by a 0.18×0.78 μ "zia" on a pitch of 0.52 μ and having a nominal resistance of 40 ohms.

Exemplary bias conditions (i.e., the nominal voltages) for both read and write conditions are found in Table I below.

TABLE I

| Array Line | Write mode | Read mode |
| --- | --- | --- |
| Bit Line - Selected | 10 volts | 2.0-2.4 volts |
| Word Line - Unselected | 9 volts | 2.0-2.4 volts |
| Bit Line - Unselected | 1 volt | Ground |
| Word Line - Selected | Ground | Ground |

Other useful biasing conditions are described further in "Method and Apparatus for Biasing Selected and Unselected Array Lines When Writing a Memory Array" to Scheuerlein, U.S. Pat. No. 6,618,295, which application is hereby incorporated by reference in its entirety. Preferred programming methods which reduce disturb effects on half-selected and unselected memory cells are described in U.S. Pat. No. 6,822,903 to Scheuerlein, et al., entitled "Apparatus and Method for Disturb-Free Programming of Passive Element Memory Cells," the disclosure of which is hereby incorporated by reference in its entirety.

Referring again to the word line driver circuit 233 shown in FIG. 3, each of these four word line drivers 254 is preferably disposed beneath the memory array. These word line drivers 254 must be laid out on the pitch of two word lines within the memory block (since the word lines are interleaved and only half are driven from each side of a memory block). Moreover, the word line drivers are called upon to drive to high voltage levels, and thus incorporate high voltage transistors (relative to other transistors incorporated within the integrated circuit).

Such high voltage transistors frequently have a longer channel length (i.e., gate stripe width) than normal transistors, and consequently fitting such high voltage transistors into tight-pitched layouts, such as the circuitry directly interfacing to memory layers, is extremely challenging.

Figure 5:
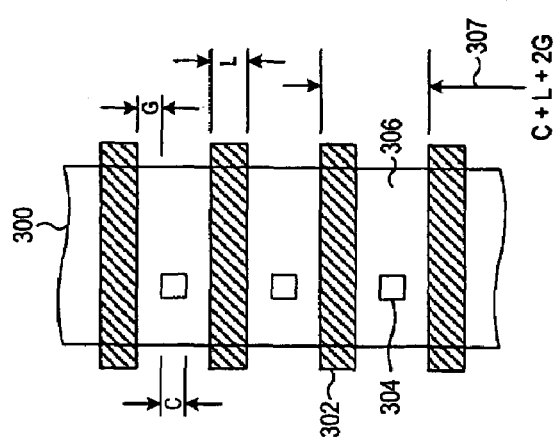
FIG. 5 is a diagram of a traditional circuit layout for implementing multiple array line driver transistors.

Referring now to FIG. 5, a layout is shown of an active area stripe 300 and alternating gate electrodes (e.g., polysilicon ("poly") gate electrode 302) and source/drain contacts (e.g., contact 304). The gate electrodes intersect the active area stripe to define individual source/drain regions, such as source/drain region 306. The pitch of such a structure is equal to C+L+2G, where C is the width of each contact, L is the width of each gate stripe (which, of course, determines the electrical channel length of the resulting transistor), and G is the spacing from source/drain contact to gate electrode.

Figure 6:
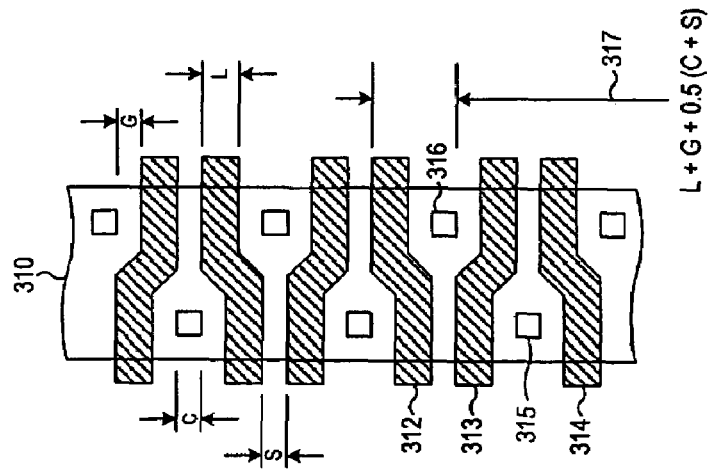
FIG. 6 is a diagram of circuit layout useful for implementing multiple transistors, incorporating bent-gate transistors.

The pitch may be reduced by using "bent gate" transistors and staggering the source/drain contacts, as shown in FIG. 6. Here a layout is shown of an active area stripe 310 and alternating gate electrodes (e.g., gate electrode 312) and source/drain contacts (e.g., contact 315). However, the bent gate layout provides for a pair of gate electrodes 312, 313 which spread farther apart and thus bend away from a contact 316 toward the right side of the active area stripe 310, and yet bend closer together to accommodate a contact 315 toward the left side of the active area stripe 310. In other words, the gate electrodes 312, 313 are closer together at the left side of the active area stripe 310 than at the right side of the stripe, so that a staggered contact 316 may be placed in the source/drain region between the gate electrodes 312, 313 near the right side of the stripe. Conversely, gate electrodes 313, 314 are closer together at the right side of the active area stripe 310 than at the left side of the stripe, so that a staggered contact 315 may be placed in the source/drain region between the gate electrodes 313, 314 near the left side of the stripe.

The pitch of such a structure is equal to L+G+0.5(C+S), where L is the width of each gate stripe, G is the spacing from source/drain contact to gate electrode, C is the width of each contact, and S is the gate-to-gate (i.e., "poly-to-poly" space). This represents an improvement in pitch equal to G+0.5(C−S). For an exemplary semiconductor technology, the values of these variables may be expressed as a function of the fundamental technology dimension, $\lambda$. If C=1.2$\lambda$, G=$\lambda$, and S=1.6$\lambda$, then the improvement in pitch of the bent gate layout over the straight transistor layout is 0.8$\lambda$. This amount, almost equal to the fundamental technology dimension, is particularly significant when designing layouts which must match the pitch of a dense memory array.

Figure 7:
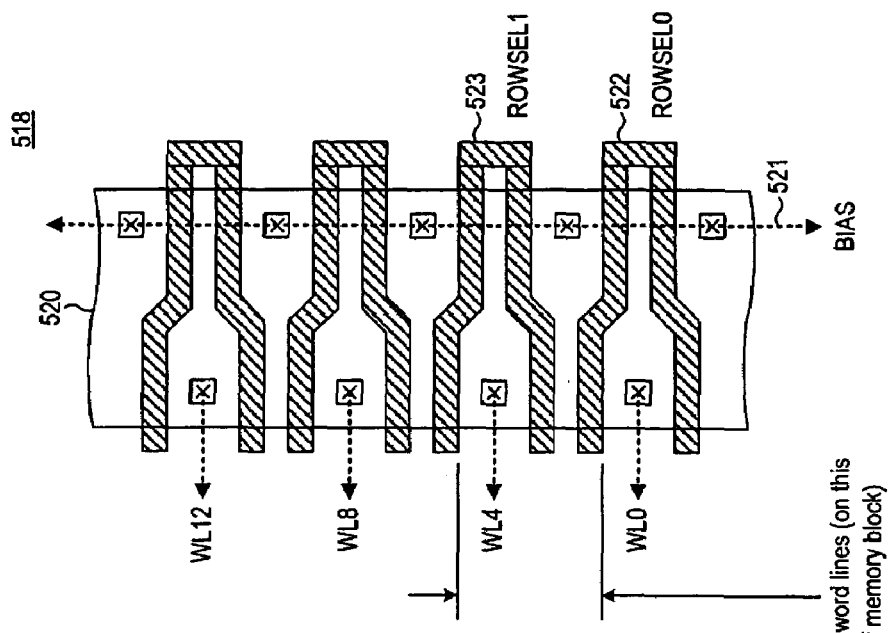
FIG. 7 is a diagram of circuit layout useful for implementing multiple array line driver transistors, incorporating bent-gate transistors.

Referring now to FIG. 7, the bent gate transistor layout may be utilized to form the NMOS transistors (e.g., transistor 258) of the word line drivers 254 by connecting pairs of gate electrodes to form a single transistor gate, and coupling every other source/drain region to the bias node 521 for the active area stripe 520, and coupling remaining source/drain regions to a respective word line. In this configuration 518, the pitch of these drivers is therefore 2(L+G)+C+S (being twice the pitch of each individual gate electrode). Each NMOS transistor shown would be coupled to a respective row select line, as each of these transistors shares the same bias line 521. For example, gate electrode 522 would be coupled to ROWSEL0, while gate electrode 523 would be coupled to ROWSEL1.

For an exemplary 0.15 $\mu$ technology, having L=0.68 $\mu$, C=0.18 $\mu$, G=0.15 $\mu$, and S=0.241 $\mu$, the NMOS driver transistor pitch is therefore 2.08 $\mu$. For comparison, if implemented using the straight gate electrodes of FIG. 5, such driver pitch would be 2.32 $\mu$. In an exemplary embodiment, this NMOS driver pitch of 2.08 $\mu$ corresponds to four word lines driven from one side of a memory block (in the vertical connection area between memory blocks). Since four word lines are also driven from the other side of the same block, the array will actually have eight word lines in this NMOS driver pitch, for a word line pitch of 0.26 $\mu$.

Figure 8:
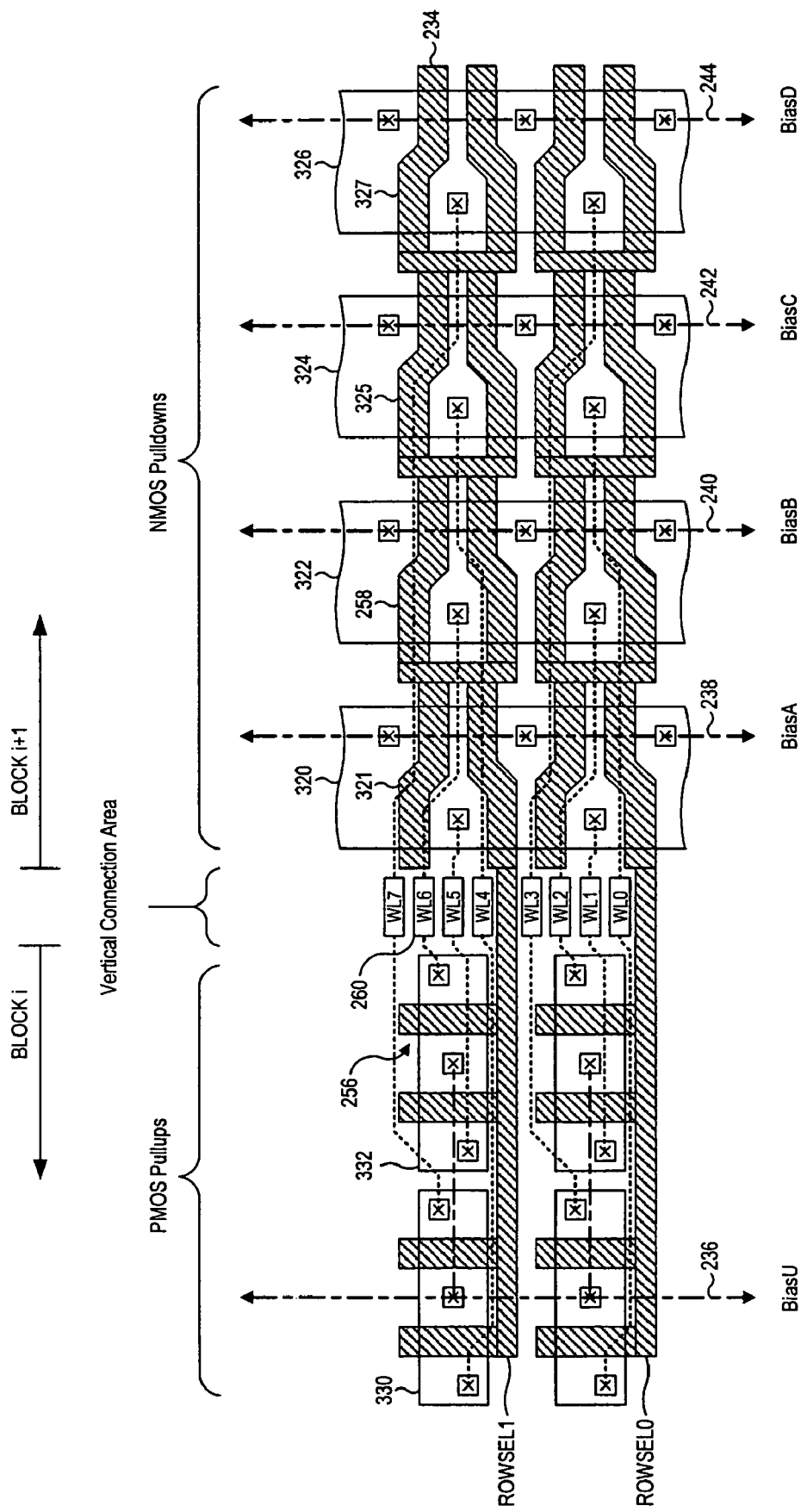
FIG. 8 is a diagram of an exemplary circuit layout of a four-headed word line driver circuit as shown in FIG. 3.

Referring now to FIG. 8, a total of four such NMOS driver transistor stripes 518 may be placed next to each other to provide four NMOS driver transistors within this 2.08 $\mu$ pitch to achieve a layout for the word line driver circuit 233 shown in FIG. 3. Four vertical active area stripes 320, 322, 324, and 326 are shown, each disposed beneath a memory block BLOCK i+1. In each active area stripe, a plurality of gate electrodes intersects the active area stripe to define individual source/drain regions. Every other source/drain region is coupled to a bias node for the active area stripe, and remaining source/drain regions are respectively coupled to a respective word line associated with the memory block BLOCK i+1. Thus, a respective NMOS driver transistor for the respective word line is formed. The four active area stripes 320, 322, 324, and 326 are respectively associated with four bias lines BiasA (also labeled 238), BiasB (also labeled 240), BiasC (also labeled 242), and BiasD (also labeled 244). A single row select line is coupled to the gate terminal of one transistor in each active area stripe. For example, row select line ROWSEL 234 is coupled to the gate terminal of transistors 321, 258, 325, and 327.

Also shown are four active area features, such as active area features 330 and 332, each disposed beneath an adjacent memory block BLOCK i. For example, each of active area features 330 and 332 includes a respective pair of gate electrodes intersecting the active area feature to form a total of four PMOS transistors, the gate of each being coupled to the same row select line, ROWSEL 234. The central source/drain node between each pair of PMOS transistors is coupled to the unselected bias node BiasU, also labeled node 236.

A connection area is provided between the NMOS driver transistors and the PMOS driver transistors, which is also between the adjacent memory blocks BLOCKi and BLOCKi+1 (and also along the left side of the memory block BLOCK i+1) for making a vertical connection from an electrode connecting the NMOS and PMOS transistors together (represented here as a dotted line), to a corresponding word line. For example, the word line driver 254 (shown in FIG. 3) includes an NMOS transistor 258 having a source coupled to the BiasB line 240, and having a drain coupled to a vertical connection 260, and further includes a PMOS transistor 256 having a source coupled to the BiasU line 236, and having a drain coupled to the vertical connection 260. In FIG. 8, this vertical connection 260 is associated with a word line labeled WL6.

Figure 9:
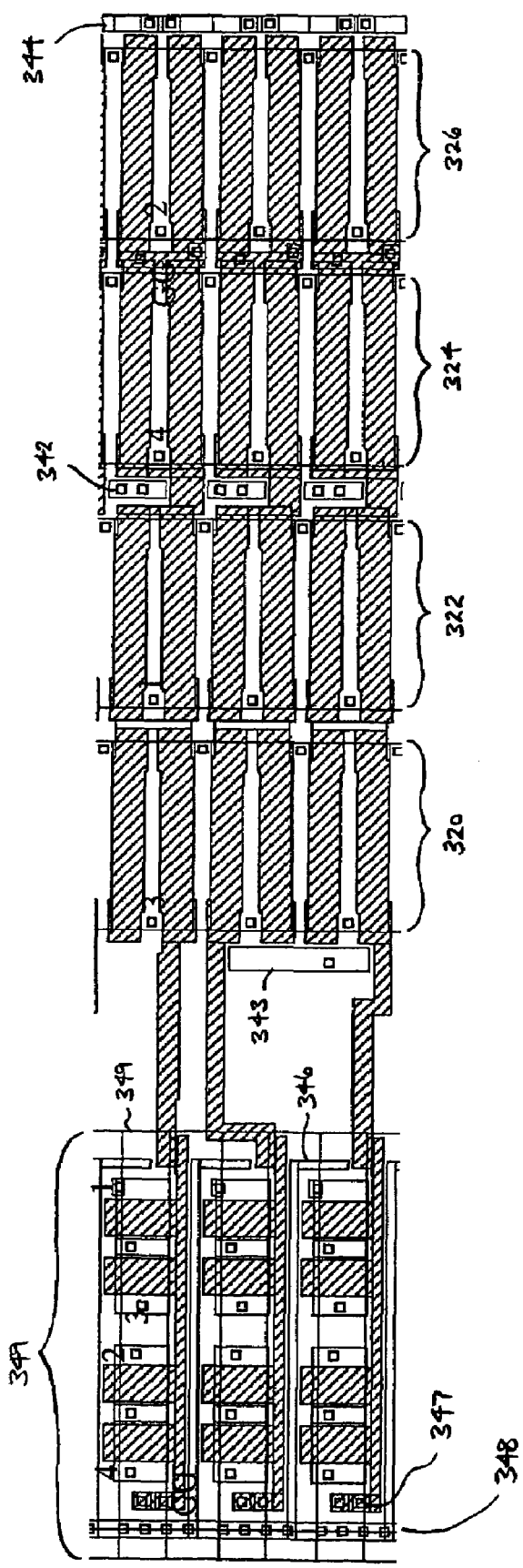
FIG. 9 is a diagram, showing certain layers, of an exemplary circuit layout of a four-headed word line driver circuit as shown in FIG. 3.
Figure 10:
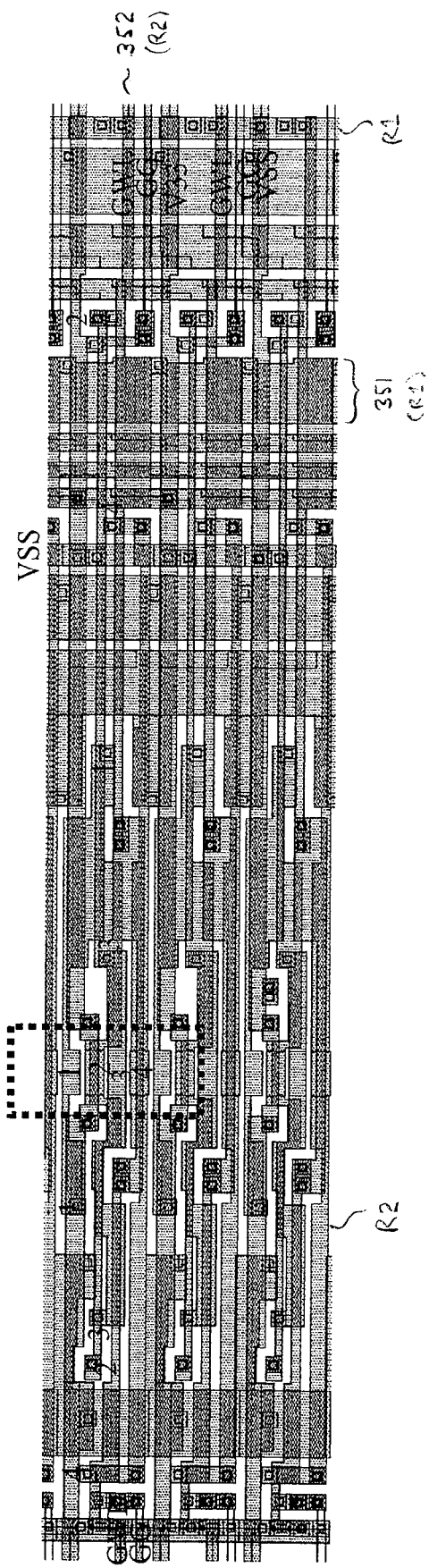
FIG. 10 is a diagram, showing certain layers, of an exemplary circuit layout of a four-headed word line driver circuit as shown in FIG. 3.

While this figure represents a relative arrangement in accordance with some embodiments of the invention, some details have been simplified for clarity. Referring now to FIG. 9 and FIG. 10, a more accurate diagram is shown of an exemplary embodiment of a similar circuit and layout arrangement. FIG. 9 shows the active area layer, the gate layer, the substrate (well) taps, and the contacts to active area and gates. The four active area stripes 320, 322, 324, and 326 are shown. Three columns of substrate taps (e.g., substrate taps 342, 343, and 344) couple the local substrate potential (or alternatively, the local well potential) to a suitable bias level (e.g., ground). Each group of four PMOS transistors is virtually surrounded by a well tap, such as well tap 346, each well tap coupling the well 349 to well bias node 348. A single contact (e.g., contact 347) is provided for coupling a row select line to all eight transistors (i.e., four NMOS pulldowns, and four PMOS pull-ups), and the row select signal routed in the polysilicon layer to all eight transistors. FIG. 10 shows two layers of metal, with the lower RI layer generally traversing vertically (e.g., metal feature 351 conveying BiasC), and the upper R2 layer generally traversing horizontally (e.g., metal feature 352 conveying a global word line).

Referring now to FIG. 11, a block diagram is shown indicating the location of the NMOS and PMOS driver transistors relative to the connection areas between each memory block, generally corresponding to that shown in FIGS. 8-10. The PMOS drivers (e.g., 382) are to the left of each connection area (e.g., 383), while the NMOS drivers (e.g., 384) are to the right of each connection area. Thus, beneath each memory block, PMOS drivers are disposed on one side of the block, and unrelated NMOS drivers are disposed on the other side. For example, beneath memory block 380 are PMOS drivers 382 on the right side and unrelated NMOS drivers 386 on the left side. Depending on the size of the memory block, the PMOS drivers, and the NMOS drivers, there may be sufficient space for other circuits, such as a sense amplifier 387.

FIG. 12 illustrates another useful arrangement. Memory block 402 includes PMOS drivers 406 associated with the connection area 410 to the left of the block, as well as PMOS drivers 407 associated with the connection area 411 to the right of the block. Memory block 404 includes NMOS drivers 408 associated with the connection area 411 to the left of the block, as well as NMOS drivers 409 associated with the connection area 412 to the right of the block. If one of the NMOS or PMOS drivers is smaller than the other, then a larger circuit may fit beneath the memory block including the smaller type of drivers. For example, the PMOS drivers 406, 407 are shown here as being much smaller than the NMOS drivers 408, 409, and a larger sense amplifier circuit 413 or other circuitry may be located between the PMOS drivers 406 and 407 than between the NMOS drivers 408 and 409.

Figure 13:
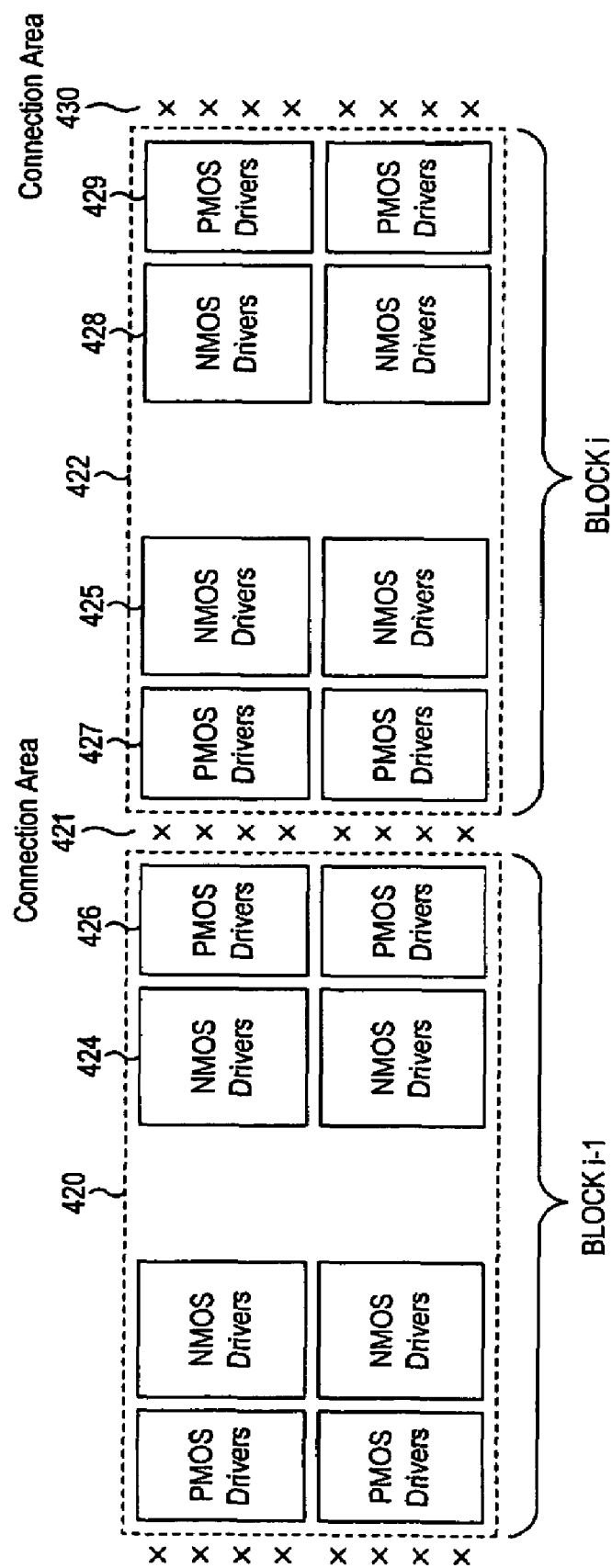
FIG. 13 is a block diagram of a useful relative arrangement of driver transistors for a multi-headed array line driver circuit.

FIG. 13 illustrates another useful arrangement. Half of the NMOS and PMOS drivers associated with a connection area are on one side of the connection area, while the other half of the associated NMOS and PMOS drivers are on the other side of the connection area. For example, NMOS drivers 424, 425 and PMOS drivers 426, 427 are all associated with driving respective word lines through connection area 421. Memory block 420 includes NMOS drivers 424 and PMOS drivers 426 associated with the connection area 421 to the right of the block. Memory block 422 includes NMOS drivers 425 and PMOS drivers 427 associated with the connection area 421 to the left of the block, as well as NMOS drivers 428 and PMOS drivers 429 associated with the connection area 430 to the right of the block.

While the embodiment shown thus far include four NMOS and PMOS drivers within each word line driver circuit 233, other numbers of driver devices (e.g., two pairs of NMOS and PMOS) are contemplated as well. In addition, a number which is other than an integral power of 2 may also be advantageously employed. For example, six NMOS and six PMOS drivers may be used, particularly using the arrangement shown in FIG. 13. In such a non-binary case, the physical addressing may be configured to leave "holes" in the decode map, such as a hole in a group of eight address that includes the six physically decoded addresses, where the last two addresses would have otherwise been. Control circuitry may be configured to map an external address space into a larger address space having the holes. Consequently, the physical decoding can still be largely binary in structure.

In each of these block diagrams, while the locations of NMOS and PMOS driver transistors are described, the block diagrams should be viewed as well for other embodiments, which may include other types of pullup and pulldown devices. Also, even though the above descriptions may use the phrase of a memory block "including" a NMOS driver or PMOS driver block, it should be understood that such NMOS or PMOS driver block is beneath the memory block and may be associated with more than one block if word lines are shared between blocks.

Figure 17:
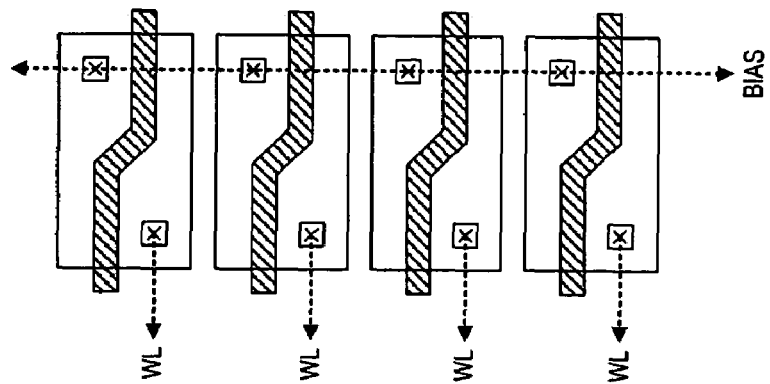
FIG. 17 is a diagram of circuit layout useful for implementing multiple array line driver transistors, incorporating bent-gate transistors.
Figure 16:
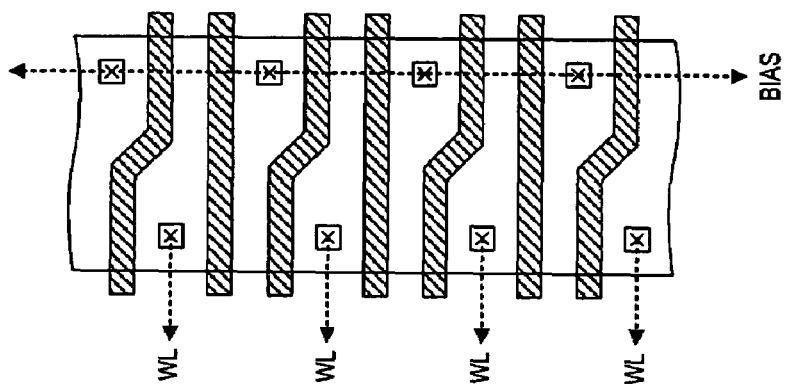
FIG. 16 is a diagram of circuit layout useful for implementing multiple array line driver transistors, incorporating bent-gate transistors.
Figure 15:
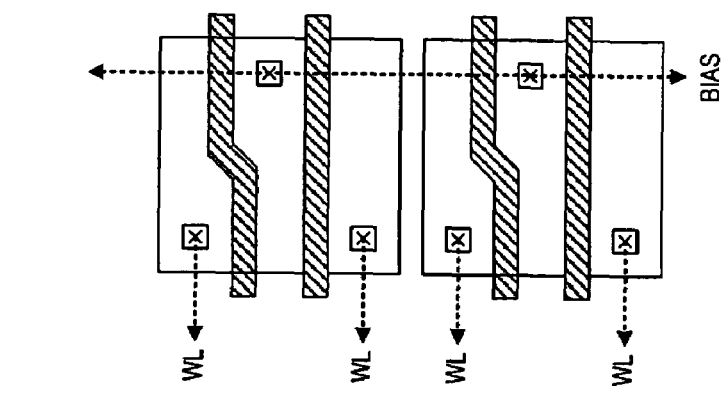
FIG. 15 is a diagram of circuit layout useful for implementing multiple array line driver transistors, incorporating bent-gate transistors.
Figure 14:
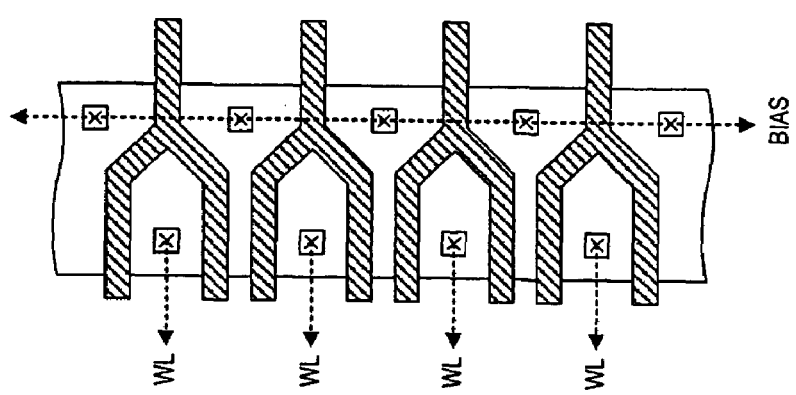
FIG. 14 is a diagram of circuit layout useful for implementing multiple array line driver transistors, incorporating bent-gate transistors.

FIG. 14 depicts another useful configuration of a bent-gate transistor, in which a pair of gate electrodes are joined before exiting the right side of the active area. FIG. 15 depicts another useful configuration showing active area regions (also referred to as "islands"), each including a pair of gate electrodes, in which alternating ones of the pair of gate electrodes are bent gate transistors. FIG. 16 depicts an active area stripe in which alternating ones of the gate electrodes are bent gate transistors. FIG. 17 depicts another useful configuration showing active area islands, each including a bent gate transistor gate electrode.

In certain embodiments, the driver transistors within the array line driver circuits are higher voltage devices relative to other transistors implemented elsewhere on the integrated circuit. Such devices may have a higher threshold voltage, may have a thicker gate dielectric, and may have a longer electrical length than such other transistors. For example, such higher voltage devices may have an electrical length that is at least twice the nominal electrical length of such other transistors.

In certain embodiments, array line driver circuits including bent-gate transistors disposed beneath a memory array may be advantageously utilized in memory array incorporating segmented bit lines, such as the arrays described in U.S. patent application Publication Ser. No. U.S. 2004/0188714 A1, by Roy E. Scheuerlein, et al, entitled "Three-Dimensional Memory Device Incorporating Segmented Bit Line Memory Array", filed on Mar. 31, 2003, which application is hereby incorporated by reference in its entirety.

In the various embodiments, the connections between memory layers are advantageously formed as a vertical connection to reduce the overall area consumed by such connections. However, the use of such terms herein as "vertical connection" should be interpreted to include any manner of making a connection between vertically displaced (e.g. adjacent) memory layers, whether using a separate via to connect each layer to its neighboring layer, whether such vias are stacked one atop another, whether each via is laterally displaced relative to the vias above and below it, or whether any other structure is used to fashion a connection between nodes on more than one memory layer. The invention is not limited to any particular form of "vertical connection," as different processes may result in more or less desirable choices for each process. Such a vertical connection may also be conveniently termed a "zia" to imply a via-type structure connecting more than one layer in the z-direction. Preferred zia structures and related methods for their formation are described in U.S. Pat. No. 6,534,403 to Cleeves, issued Mar. 18, 2003, the disclosure of which is hereby incorporated by reference in its entirety.

In various embodiments described herein, a number of memory cells per bit line segment has been assumed for convenience of description. It should be understood that, as with any memory array design, a number of factors may influence design decisions as to the number of memory cells per word line segment as well as the number of memory cells per bit line. For example, the number of memory cells per word line segment may be heavily influenced by the total leakage current which may affect a selected or unselected bit line, by resistance of the word line segment, or by capacitance of the bit line. Similarly, the number of array blocks and the number of memory planes are also a matter of engineering decision, and the exemplary configurations described herein are only examples of selected cases and not required configurations.

It should be appreciated that the designations top, left, bottom, and right are merely convenient descriptive terms for the four sides of a memory array. The word line segments for a block may be implemented as two inter-digitated groups of word line segments oriented horizontally, and the bit lines for a block may be implemented as two inter-digitated groups of bit lines oriented vertically. Each respective group of word lines or bit lines may be served by a respective decoder/driver circuit and a respective sense circuit on one of the four sides of the array. Suitable row and column circuits are set forth in "Multi-Headed Decoder Structure Utilizing Memory Array Line Driver with Dual Purpose Driver Device," U.S. Pat. No. 6,856,572 B2, in the aforementioned "Tree Decoder Structure Particularly Well Suited to Interfacing Array Lines Having Extremely Small Layout Pitch," and in U.S. application Ser. No. 11/095,907, filed Mar. 31, 2005, entitled "Method and Apparatus for Incorporating Block Redundancy in a Memory Array" by Luca G. Fasoli and Roy E. Scheuerlein, each of which is hereby incorporated by reference in its entirety. Exemplary memory array configurations are also described in "Method and Apparatus for Incorporating Block Redundancy in a Memory Array."

Word lines may also be referred to as row lines or X-lines, and bit lines may also be referred to as column lines or Y-lines. The distinction between "word" lines and "bit" lines may carry at least two different connotations to those skilled in the art. When reading a memory array, it is assumed by some practitioners that word lines are "driven" and bit lines are "sensed." In this regard, X-lines (or word lines) are usually contemplated as being connected to the gate terminal of memory cell transistors, or the switch terminal of the memory cell switch device, if present. The Y-lines (or bit lines) are usually contemplated as being connected to a switched terminal of the memory cell (e.g., source/drain terminal). Secondly, the memory organization (e.g., data bus width, number of bits simultaneously read during an operation, etc.) may have some association with viewing one set of the two array lines more aligned with data "bits" rather than data "words." Consequently, the designations herein of X-lines, word lines, and row lines, and of Y-lines, bit lines, and column lines are illustrative of the various embodiments but should not be viewed in a restrictive sense, but rather a more general sense.

As used herein, word lines (e.g., including word line segments) and bit lines usually represent orthogonal array lines, and generally follow a common assumption in the art that word lines are driven and bit lines are sensed, at least during a read operation. Thus, the bit lines of an array may also be referred to as sense lines of the array. No particular implication should be drawn as to word organization by use of such terms. Moreover, as used herein, a "global array line" (e.g., a global word line, a global bit line) is an array line that connects to array line segments in more than one memory block, but no particular inference should be drawn suggesting such a global array line must traverse across an entire memory array or substantially across an entire integrated circuit.

As used herein, a passive element memory array includes a plurality of 2-terminal memory cells, each connected between an associated X-line and an associated Y-line. Such a memory array may be a two-dimensional (planar) array or may be a three-dimensional array having more than one plane of memory cells. Each such memory cell has a non-linear conductivity in which the current in a reverse direction (i.e., from cathode to anode) is lower than the current in a forward direction. Application of a voltage from anode to cathode greater than a programming level changes the conductivity of the memory cell. The conductivity may decrease when the memory cell incorporates a fuse technology, or may increase when the memory cell incorporates an antifuse technology. A passive element memory array is not necessarily a one-time programmable (i.e., write once) memory array.

Such passive element memory cells may generally be viewed as having a current steering element directing current in a direction and another component which is capable of changing its state (e.g., a fuse, an antifuse, a capacitor, a resistive element, etc.). The programming state of the memory element can be read by sensing current flow or voltage drop when the memory element is selected.

In various embodiments of the invention described herein, the memory cells may be comprised of semiconductor materials, as described in U.S. Pat. No. 6,034,882 to Johnson et al., and in U.S. Pat. No. 5,835,396 to Zhang, both of which are hereby incorporated by reference. Although an antifuse memory cell is preferred, other types of memory arrays, such as MRAM and organic passive element arrays, may also be used. MRAM (magnetoresistive random access memory) is based on magnetic memory elements, such as a magnetic tunnel junction (MTJ). MRAM technology is described in "A 2556 kb 3.0V 1T1MTJ Nonvolatile Magnetoresistive RAM" by Peter K. Naji et al., published in the Digest of Technical Papers of the 2001 IEEE International Solid-State Circuits Conference, ISSCC 2001/Session 7/Technology Directions: Advanced Technologies/7.6, Feb. 6, 2001 and pages 94-95, 404-405 of ISSCC 2001 Visual Supplement, both of which are hereby incorporated by reference. Certain passive element memory cells incorporate layers of organic materials including at least one layer that has a diode-like characteristic conduction and at least one organic material that changes conductivity with the application of an electric field. U.S. Pat. No. 6,055,180 to Gudensen et al. describes organic passive element arrays and is also hereby incorporated by reference. Memory cells comprising materials such as phase-change materials and amorphous solids can also be used. See U.S. Pat. No. 5,751,012 to Wolstenholme et al. and U.S. Pat. No. 4,646,266 to Ovshinsky et al., both of which are hereby incorporated by reference.

In various embodiments of the invention described herein, many different memory cell technologies are contemplated for use. Suitable three-dimensional anti-fuse memory cell structures, configurations, and processes include, without limitation, those described in: U.S. Pat. No. 6,034,882 to Johnson, et al, entitled "Vertically Stacked Field Programmable Nonvolatile Memory and Method of Fabrication"; U.S. Pat. No. 6,420,215 to Knall, et al, entitled "Three-Dimensional Memory Array and Method of Fabrication"; U.S. Pat. No. 6,525,953 to Johnson, entitled "Vertically-Stacked, Field Programmable Nonvolatile Memory and Method of Fabrication"; U.S. patent application Publication No. Ser. 2004-0002184 A1, by Cleeves, entitled "Three Dimensional Memory"; and U.S. patent application Ser. No. 10/326,470 by Herner, et al, filed Dec. 19, 2002, entitled "An Improved Method for Making a High Density Nonvolatile Memory". Each of these enumerated disclosures is incorporated herein by reference in its entirety.

Moreover, other memory array configurations having extremely dense X-line and/or Y-line pitch requirements are also contemplated such as, for example, those incorporating thin-film transistor (TFT) EEPROM memory cells, as described in "Dense Arrays and Charge Storage Devices, and Methods for Making Same," by Thomas H. Lee, et al., U.S. patent application Publication Ser. No. U.S. 2002-0028541 A1, and for those incorporating TFT NAND memory arrays, as described in "Programmable Memory Array Structure Incorporating Series-Connected Transistor Strings and Methods for Fabrication and Operation of Same" by Scheuerlein, et al., U.S. patent application Publication Ser. No. U.S. 2004-0125629 A1, and in "NAND Memory Array Incorporating Capacitance Boosting of Channel Regions in Unselected Memory Cells and Method for Operation of Same" by En-Hsing Chen, et al., U.S. patent application Publication Ser. No. U.S. 2004/0145024, which applications are hereby incorporated by reference.

The directionality of various array lines in the various figures is merely convenient for ease of description of the two groups of crossing lines in the array. While word lines are usually orthogonal to bit lines, such is not necessarily required. Moreover, the word and bit organization of a memory array may also be easily reversed. As an additional example, portions of an array may correspond to different output bits of a given word. Such various array organizations and configurations are well known in the art, and the invention is intended to comprehend a wide variety of such variations. As used herein, an integrated circuit memory array is a monolithic integrated circuit structure, rather than more than one integrated circuit device packaged together or in close proximity.

The block diagrams herein may be described using the terminology of a single node connecting the blocks. Nonetheless, it should be appreciated that, when required by the context, such a "node" may actually represent a pair of nodes for conveying a differential signal, or may represent multiple separate wires (e.g., a bus) for carrying several related signals or for carrying a plurality of signals forming a digital word or other multi-bit signal.

It will be appreciated by one skilled in the art that any of several expressions may be equally well used when describing the operation of a circuit including the various signals and nodes within the circuit, and no subtle inferences should be read into varied usage within this description. Frequently logic signals are named in a fashion to convey which level is the active level. The schematic diagrams and accompanying description of the signals and nodes should in context be clear. As use herein, two different voltages which are "substantially equal" to each other have respective values which are close enough to cause substantially the same effect under the context at issue. Such voltages may be assumed to fall within approximately 0.5 volts of each other, unless the context requires another value.

While circuits and physical structures are generally presumed, it is well recognized that in modern semiconductor design and fabrication, physical structures and circuits may be embodied in computer readable descriptive form suitable for use in subsequent design, test or fabrication stages as well as in resultant fabricated semiconductor integrated circuits. Accordingly, claims directed to traditional circuits or structures may, consistent with particular language thereof, read upon computer readable encodings and representations of same, whether embodied in media or combined with suitable reader facilities to allow fabrication, test, or design refinement of the corresponding circuits and/or structures. The invention is contemplated to include circuits, related methods or operation, related methods for making such circuits, and computer-readable medium encodings of such circuits and methods, all as described herein, and as defined in the appended claims. As used herein, a computer-readable medium includes at least disk, tape, or other magnetic, optical, semiconductor (e.g., flash memory cards, ROM), or electronic medium and a network, wireline, wireless or other communications medium. An encoding of a circuit may include circuit schematic information, physical layout information, behavioral simulation information, and/or may include any other encoding from which the circuit may be represented or communicated.

As noted above, while FIG. 3 and other figures show four array line driver circuits, the number of array line driver circuits can be other than an integral power of two (i.e., a "non-binary" number can be used). In this situation, the control circuitry would be configured to "leave holes" in the decode map. "Holes" are unused combinations of binary inputs to a decoder. Consider, for example, the situation contemplated above in which six array line driver circuits are used. In this case, three bits would be needed since two bits only decode to four possible outputs. However, three bits fully decode to eight possible outputs. Since only six outputs are needed, the control circuitry would leave two holes in the decode map by skipping the two outputs that are not needed.

Figure 18:
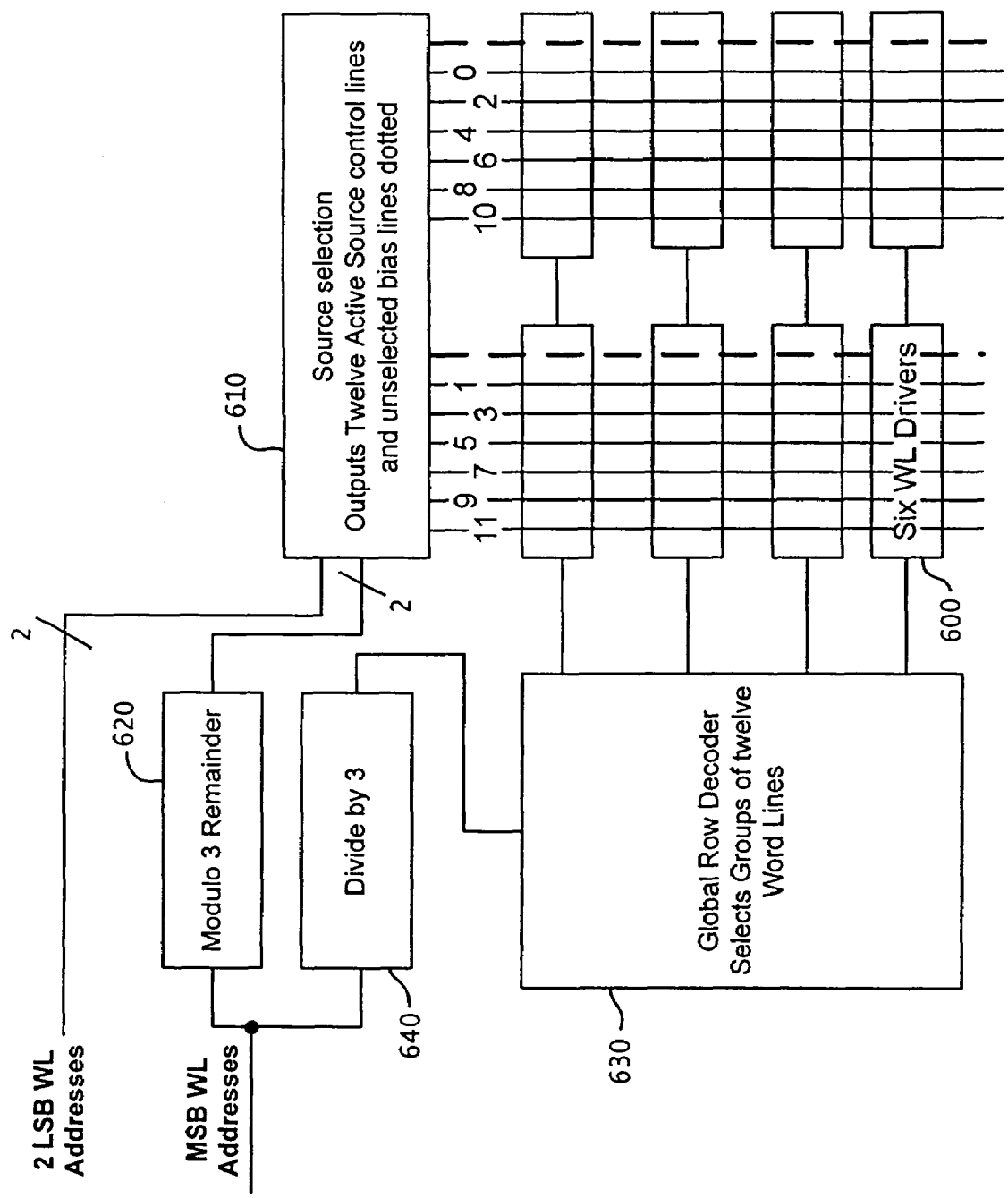
FIG. 18 is a diagram of an integrated circuit of a preferred embodiment.

FIG. 18 is a diagram of one presently preferred implementation of this concept. The integrated circuit comprises a non-binary number of array line driver circuits 600 (here, 12 word lines drivers, organized as two groups of six) coupled with a plurality of array lines of a memory array (not shown), and a decoder circuit that comprises a source selection binary decoder 610 ("the first binary decoder" or the "binary decoder portion" of the decoder circuit) and first circuitry operative to perform a non-binary arithmetic operation (here, a modulo three remainder operation) 620. The first circuitry 620 will be referred to herein as the pre-binary-decoder portion, since the output of the first circuitry 620 (i.e., the result of the non-binary arithmetic operation) is provided as input to the source selection binary decoder 610. The source selection binary decoder 610 outputs twelve active source control lines (lines 0-11) based on a four-bit binary input. The source selection binary decoder 610 also outputs unselected bias lines (shown as dotted lines in FIG. 18).

The integrated circuit also comprises a global row decoder 630 ("the second binary decoder") and second circuitry 640 operative to perform a non-binary arithmetic operation (here, a divide-by-three operation). The result of the non-binary arithmetic operation of the second circuitry 640 is provided as input to the global row decoder 630, which selects groups of twelve word lines.

FIG. 19 is a partial decode map showing the operation of the decoder circuit. In this example, a ten-bit address is provided. As shown in FIG. 18, the two least-significant bits (LSBs) of the address are provided to the source selection binary decoder 610, and the most-significant bits (MSBs) are provided to the first circuitry 620, which performs a modulo 3 remainder operation on the MSBs. The two-bit output of the first circuitry 620 is provided to the source selection binary decoder 610. As shown in FIG. 19, using the first circuitry 620 to perform the modulo 3 remainder operation results in four holes in the decode map because 1100, 1101, 1110, and 1111 are skipped. As a result, the four bits inputted to the first binary decoder 610 can be used to select one of 12 (instead of one of 16) word line drivers.

The MSBs are also provided to the second circuitry 640, which performs a divide-by-three operation and provides the result to the global row decoder 630. As show in FIG. 19, the divide-by-three operation results in the global row decoder 630 selecting a new group of word lines after every twelve word lines. This is further shown in FIG. 20, which shows the decode map compressed by groups of four word lines for 99 word lines. It should be noted that the use of non-binary arithmetic in the second circuitry 640 results in holes in the decode map of the global row decoder 630.

The use of this decoder circuit may be especially desired to address the mismatch between memory line pitch and the size of a driver device, which can be 12 to 1 in 90 nm node. It is desired to optimize the large area of driver devices, but neither 8 to 1 or 16 to 1 is optimum, as 8 to 1 can limit the density of the memory lines, and 16 to 1 can waste space in the device layout since only 12 to 1 is needed. With the embodiment described above in conjunction with FIG. 18, a group of six word line drivers are at each sub-array edge, and the non-binary arithmetic circuitry 620, 640 is shared by many sub arrays. This provides a highly efficient circuit for selecting word lines by way of groups of 12 word line drivers.

In one presently preferred embodiment, the decoder circuit is used with a memory array that comprises a three-dimensional memory array comprising a monolithic semiconductor integrated circuit incorporating more than one memory plane formed above and below each other and above a semiconductor substrate. The plurality of array line driver circuits, and the decoder circuit are disposed within the semiconductor substrate under the three-dimensional memory array. While it is presently preferred that the decoder circuit be used with the memory array and layout described above, it should be noted that decoder circuit can be used with any desired type of memory array and layout. For example, this decoder circuit can be useful for two-dimensional memories such as mask ROM or other very tight pitch memories especially as driver devices fall further behind memory pitch and a non-optimum driver layout is too large a penalty.

There are several alternatives that can be used with these embodiments. For example, while the plurality of array lines preferably comprise word lines and the plurality of array line driver circuits comprise word line driver circuits, this embodiment can be used with bit lines and bit line drives instead of or in conjunction with word lines and word line drivers (e.g., the decoder circuitry described above can be used if a bit line driver is optimized to 12 to 1 from 16 to 1). Also, while the decoder circuit was described above with respect to selecting one of a non-binary number of array line driver circuits, the decoder can be used in different contexts (i.e., the decoder circuit can be used to select one of a plurality of items, not necessarily array line driver circuits). Accordingly, in the most general terms, the decoder circuit has a circuit pre-decode portion that performs non-binary arithmetic and a circuit portion that is a binary decoder. As an alternate description, the decoder circuit has a post-decode portion that has a non-binary multiplicity, which is sometimes referred to the number of heads or drivers associated with each decoder output. Also, while modulo three remainder, and divide-by-three operations were used in the example described above, it would be understood that other non-binary arithmetic operations can be used (e.g., divide by five, and modulo 5 remainder).

It is recognized that it may be inexpensive to include some extra word line drivers at the bottom of a large array to increase the total count of drivers to an integral power of two, but it would be very inefficient to include extra word line drivers in each group of six to eight, for example. Accordingly, as another alternative, the array line driver circuits can be organized in a plurality of groups, where the number of array line driver circuits in at least one of the plurality of groups is other than an integral power of two. The array line driver circuits in at least one of the plurality of groups can share a control input signal provided by the control circuitry. Also, the memory can comprise a plurality of sub arrays (i.e., a continuous matrix of cells uninterrupted by breaks in the array lines), and at least one of the plurality of the groups of array line driver circuits can support one or two sub arrays of memory cells. As before, control circuitry would be configured to select one of the array line driver circuits.

The foregoing details description has described only a few of the many possible implementations of the present invention. For this reason, this detailed description is intended by way of illustration, and not by way of limitations. Variations and modifications of the embodiments disclosed herein may be made based on the description set forth herein, without departing from the scope and spirit of the invention. It is only the following claims, including all equivalents, that are intended to define the scope of this invention. Moreover, the embodiments described above are specifically contemplated to be used alone as well as in various combinations. Accordingly, other embodiments, variations, and improvements not described herein are not necessarily excluded from the scope of the invention.

What is claimed is:

1. An integrated circuit comprising:
   a memory array comprising a plurality of array lines;
   a number of array line driver circuits coupled with the plurality of array lines, wherein the number is other than an integral power of two; and
   control circuitry configured to select one of the array line driver circuits, wherein the control circuitry comprises a binary decoder comprising a plurality of outputs, wherein each output drives a non-binary number of array line driver circuits.

2. The integrated circuit of claim 1, wherein the number comprises six.

3. The integrated circuit of claim 1, wherein the control circuitry is operative to leave holes in a decode map.

4. The integrated circuit of claim 1, wherein the control circuitry further comprises a pre-binary-decoder portion operative to perform a non-binary arithmetic operation.

5. The integrated circuit of claim 1, wherein the plurality of array lines comprise word lines, and wherein the plurality of array line driver circuits comprise word line driver circuits.

6. The integrated circuit of claim 1 further comprising:
   circuitry operative to perform a non-binary arithmetic operation, wherein a result of the non-binary arithmetic operation is provided as input to the binary decoder.

7. The integrated circuit of claim 1, wherein the memory array comprises a three-dimensional memory array comprising a monolithic semiconductor integrated circuit incorporating more than one memory plane formed above and below each other and above a semiconductor substrate, and wherein the plurality of array line driver circuits and the decoder circuit are disposed within the semiconductor substrate under the three-dimensional memory array.

8. The integrated circuit of claim 1, wherein the memory array comprises a continuous matrix of memory cells.

9. The integrated circuit of claim 4, wherein the non-binary arithmetic operation comprises a modulo three remainder operation.

10. The integrated circuit of claim 6, wherein the non-binary arithmetic operation comprises a divide-by-three operation.

11. An integrated circuit comprising:
a memory array comprising a plurality of array lines;
a non-binary number of array line driver circuits coupled with the plurality of array lines; and
a decoder circuit coupled with the non-binary number of array line driver circuits, the decoder circuit comprising:
a binary decoder; and
circuitry operative to perform a non-binary arithmetic operation, wherein a result of the non-binary arithmetic operation is provided as input to the binary decoder.

12. The integrated circuit of claim 11, wherein the number comprises six.

13. The integrated circuit of claim 11, wherein the non-binary arithmetic operation comprises a modulo three remainder operation.

14. The integrated circuit of claim 11, wherein the plurality of array lines comprise word lines, and wherein the plurality of array line driver circuits comprise word line driver circuits.

15. The integrated circuit of claim 11 further comprising:
a second binary decoder, the second binary decoder operative to select a group of array lines; and
second circuitry operative to perform a non-binary arithmetic operation, wherein a result of the non-binary arithmetic operation of the second circuitry is provided as input to the binary decoder.

16. The integrated circuit of claim 11, wherein the memory array comprises a three-dimensional memory array comprising a monolithic semiconductor integrated circuit incorporating more than one memory plane formed above and below each other and above a semiconductor substrate, wherein the plurality of array line driver circuits and the decoder circuit are disposed within the semiconductor substrate under the three-dimensional memory array.

17. The integrated circuit of claim 11, wherein the memory array comprises a continuous matrix of memory cells.

18. The integrated circuit of claim 15, wherein the non-binary arithmetic operation performed by the second binary decoder comprises a divide-by-three operation.

19. An integrated circuit comprising:
a binary decoder; and
circuitry operative to perform a non-binary arithmetic operation, wherein a result of the non-binary arithmetic operation is provided as input to the binary decoder.

20. The integrated circuit of claim 19, wherein the binary decoder comprises a post-decode portion comprising a non-binary multiplicity.

21. The integrated circuit of claim 19, wherein the binary decoder is operative to select one of a non-binary number of array line driver circuits coupled with plurality of array lines of a memory array.

22. The integrated circuit of claim 19, wherein the non-binary arithmetic operation comprises a modulo three remainder operation.

23. The integrated circuit of claim 19 further comprising a memory array comprising a continuous matrix of memory cells.

24. An integrated circuit comprising:
a memory array comprising a plurality of array lines;
a plurality of groups of array line driver circuits coupled with the plurality of array lines;
a number of array line driver circuits in at least one of the plurality of groups of array line driver circuits, wherein the number is other than an integral power of two; and
control circuitry configured to select one of the array line driver circuits, wherein the control circuitry comprises a binary decoder comprising a plurality of outputs, wherein each output drives a non-binary number of array line driver circuits.

25. The integrated circuit of claim 24, wherein the array line driver circuits in at least one of the plurality of groups share a control input signal provided by the control circuitry.

26. The integrated circuit of claim 24, wherein the memory array comprises a plurality of sub arrays, and wherein at least one of the plurality of the groups of array line driver circuits support one or two sub arrays of memory cells.

27. The integrated circuit of claim 24, wherein the memory array comprises a continuous matrix of memory cells.

* * * * *